US011600561B2

(12) United States Patent
Saito et al.

(10) Patent No.: US 11,600,561 B2
(45) Date of Patent: Mar. 7, 2023

(54) SEMICONDUCTOR DEVICE

(71) Applicant: Rohm Co., Ltd., Kyoto (JP)

(72) Inventors: Koshun Saito, Kyoto (JP); Yasufumi Matsuoka, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/643,979

(22) Filed: Dec. 13, 2021

(65) Prior Publication Data

US 2022/0102265 A1 Mar. 31, 2022

Related U.S. Application Data

(63) Continuation of application No. 16/573,244, filed on Sep. 17, 2019, now Pat. No. 11,227,827.

(30) Foreign Application Priority Data

Sep. 19, 2018 (JP) .............................. JP2018-174816

(51) Int. Cl.
*H01L 23/498* (2006.01)
*H01L 23/00* (2006.01)
(Continued)

(52) U.S. Cl.
CPC .... *H01L 23/49844* (2013.01); *H01L 23/3121* (2013.01); *H01L 24/49* (2013.01); *H01L 25/072* (2013.01); *H01L 2924/13091* (2013.01)

(58) Field of Classification Search
CPC ... H01L 23/49844; H01L 24/49; H01L 24/05; H01L 24/06; H01L 24/32; H01L 24/48; H01L 24/73; H01L 25/072; H01L 23/3121
See application file for complete search history.

(56) References Cited

U.S. PATENT DOCUMENTS

2005/0258520 A1* 11/2005 Dolan ............... H01L 23/49503
257/E23.037
2011/0186901 A1* 8/2011 Ushiyama ............... H01L 24/97
257/E33.056
(Continued)

FOREIGN PATENT DOCUMENTS

JP 2005-229010 A 8/2005
JP 2007-134585 A 5/2007
(Continued)

OTHER PUBLICATIONS

Office Action received in the corresponding Japanese Patent application, dated Jun. 14, 2022, and machine translation (18 pages).

*Primary Examiner* — Marc Anthony Armand
(74) *Attorney, Agent, or Firm* — Hamre, Schumann, Mueller & Larson, P.C.

(57) ABSTRACT

A semiconductor device includes a semiconductor element, a first lead including a mounting portion for the semiconductor element and a first terminal portion connected to the mounting portion, and a sealing resin covering the semiconductor element and a portion of the first lead. The mounting portion has a mounting-portion front surface and a mounting-portion back surface opposite to each other in a thickness direction, with the semiconductor element mounted on the mounting-portion front surface. The sealing resin includes a resin front surface, a resin back surface and a resin side surface connecting the resin front surface and the resin back surface. The mounting-portion back surface of the first lead is flush with the resin back surface. The first terminal portion includes a first-terminal-portion back surface exposed from the resin back surface, in a manner such that the first-terminal-portion back surface extends to the resin side surface.

18 Claims, 14 Drawing Sheets

(51) Int. Cl.
    *H01L 25/07*     (2006.01)
    *H01L 23/31*     (2006.01)

(56) References Cited

U.S. PATENT DOCUMENTS

2018/0218969 A1    8/2018    Nakamura et al.
2020/0126896 A1    4/2020    Yoshioka et al.

FOREIGN PATENT DOCUMENTS

JP    2013-69720 A    4/2013
JP    2017-201675 A    11/2017

\* cited by examiner

SEMICONDUCTOR DEVICE

FIELD

The present disclosure relates to semiconductor devices.

BACKGROUND

Semiconductor devices incorporating active elements (such as transistors) are available in various configurations. JP-A-2013-69720, for example, discloses a conventional semiconductor device which includes a semiconductor element, a die pad, a plurality of leads and a sealing resin. The semiconductor element is attached to the die pad and electrically connected to the leads. The sealing resin covers the semiconductor element and the leads in a predetermined manner. The bottom surface of the die pad is exposed from the sealing resin to be used as a terminal or heat-dissipating area that will be bonded to a corresponding part of e.g., a circuit board when the semiconductor device is mounted on the board.

Due to the above configuration of the conventional semiconductor device, one cannot see the bonding portion between the terminal (or heat-dissipating outlet) and the circuit board once the semiconductor device has been mounted on the circuit board. Unfavorably, such concealment of the bonding portion hinders visual checking of the bonding state between the terminal and the circuit board, which is disadvantageous to achieving efficient inspection of the soundness of the bonding portion.

SUMMARY

In light of the above circumstances, the present disclosure aims to provide a semiconductor device with which the soundness of the bonding between the semiconductor device (in particular, a lead carrying a semiconductor element) and an external support member (such as a circuit board) can be confirmed simply by inspecting the appearance of the assembly of the semiconductor device and the support member.

According to an aspect of the present disclosure, there is provided a semiconductor device including: a semiconductor element; a first lead that includes a mounting portion on which the semiconductor element is mounted, and a first terminal portion connected to the mounting portion; and a sealing resin covering the semiconductor element and a portion of the first lead. The mounting portion includes a mounting-portion front surface and a mounting-portion back surface that are opposite to each other in a thickness direction, with the semiconductor element being mounted on the mounting-portion front surface. The sealing resin includes a resin front surface, a resin back surface and a resin side surface, where the resin front surface and the resin back surface are opposite to each other in the thickness direction, and the resin side surface connects the resin front surface and the resin back surface. The mounting-portion back surface is flush with the resin back surface. The first terminal portion includes a first-terminal-portion back surface exposed from the resin back surface. The first-terminal-portion back surface extends to the resin side surface.

Other features and advantages of the present disclosure will be more apparent from the detailed description given below with reference to the accompanying drawings.

DRAWINGS

EMBODIMENTS

The following describes embodiments of semiconductor device in accordance with the present disclosure with reference to the accompanying drawings.

With reference to FIGS. 1 to 7, a semiconductor device A1 according to a first embodiment will be described. The semiconductor device A1 includes a plurality of leads 1 to 5, a semiconductor element(s) 6, bonding wires 71 and 72, and a sealing resin 8. In the illustrated example, as described in detail below, the semiconductor device A1 includes two semiconductor elements 6a, 6b.

Figure 1:
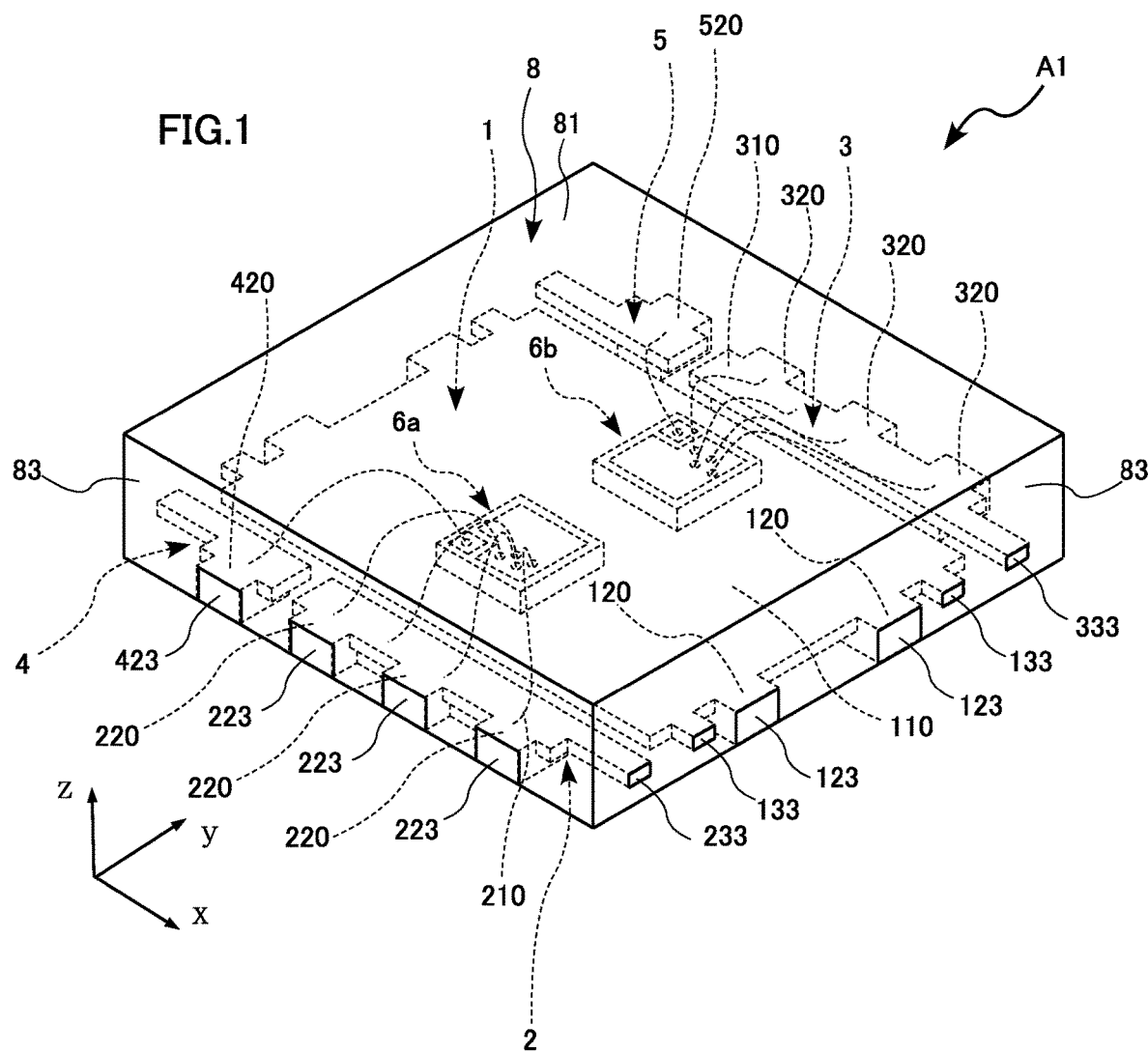
FIG. 1 is a perspective view of a semiconductor device according to a first embodiment.
Figure 2:
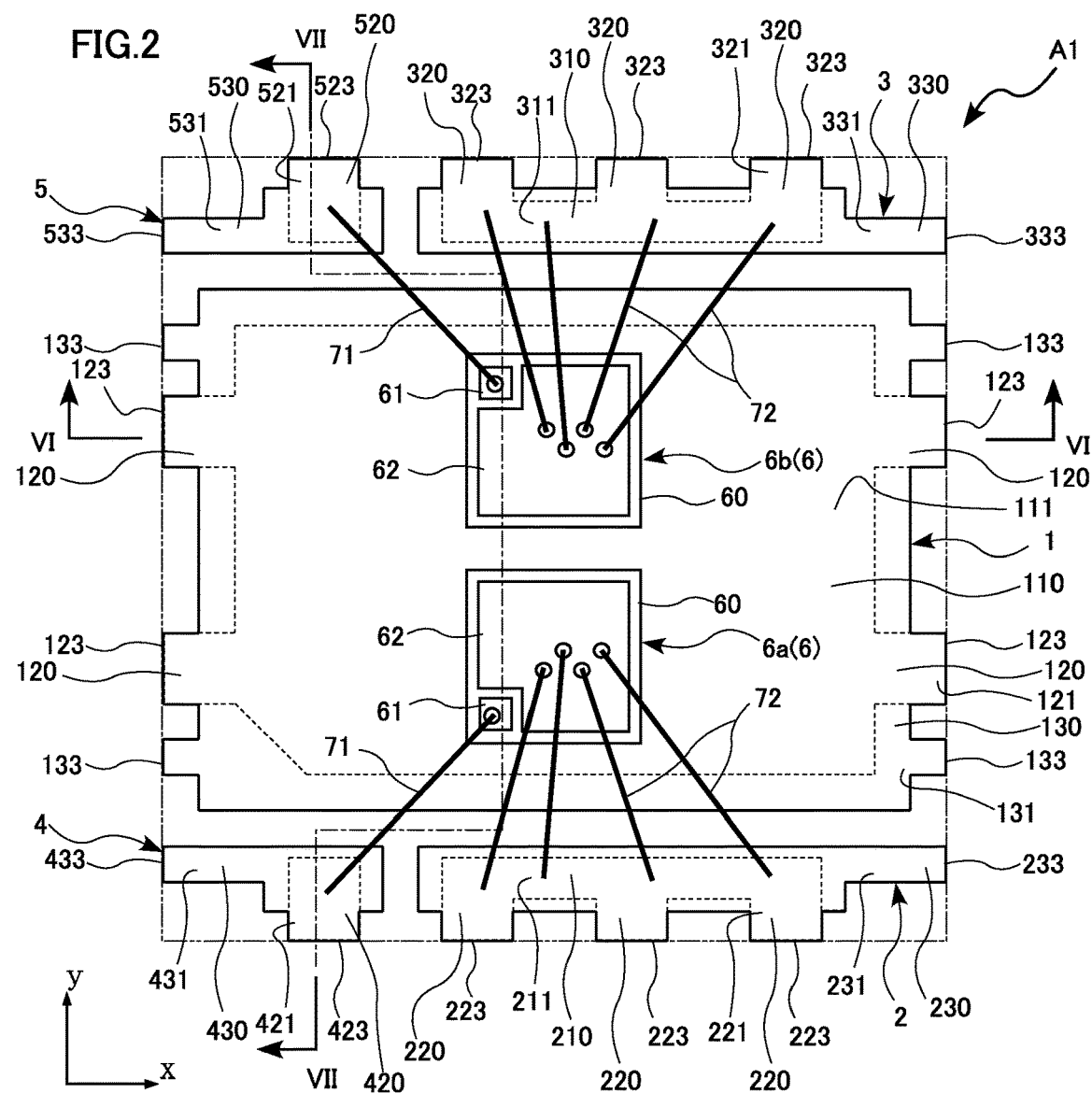
FIG. 2 is a plan view of the semiconductor device shown in FIG. 1.
Figure 3:
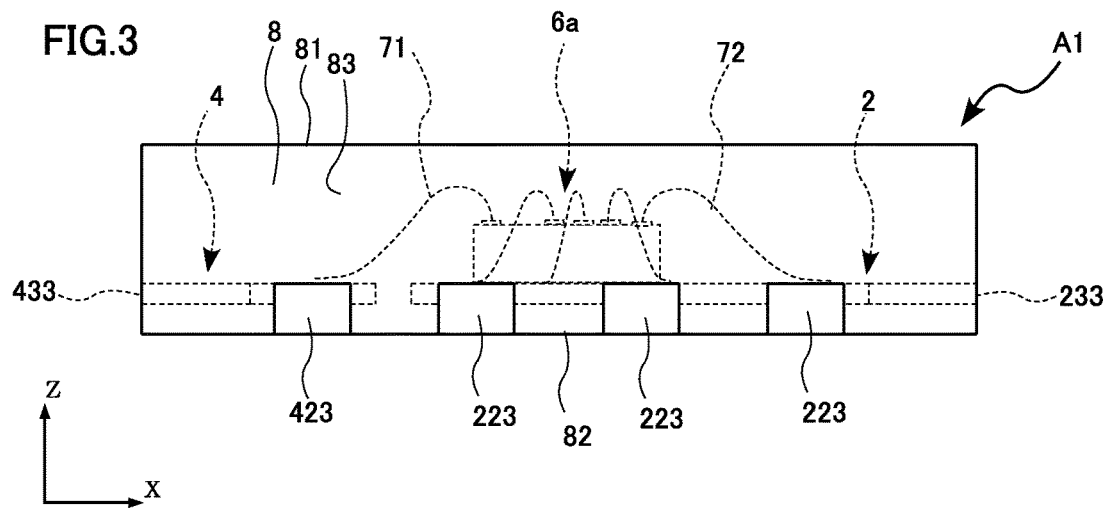
FIG. 3 is a front view of the semiconductor device shown in FIG. 1.
Figure 4:
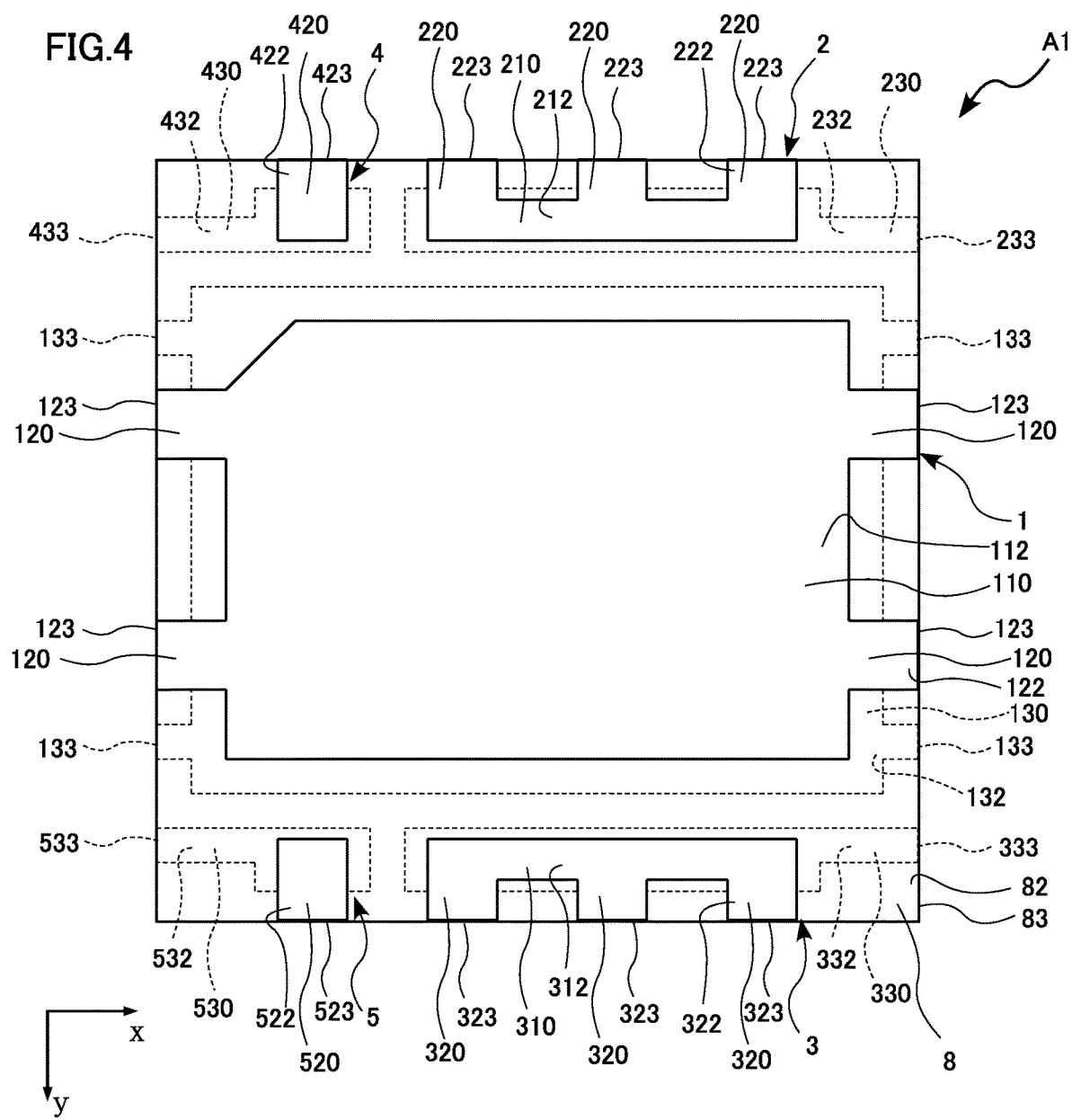
FIG. 4 is a bottom view of the semiconductor device shown in FIG. 1.
Figure 5:
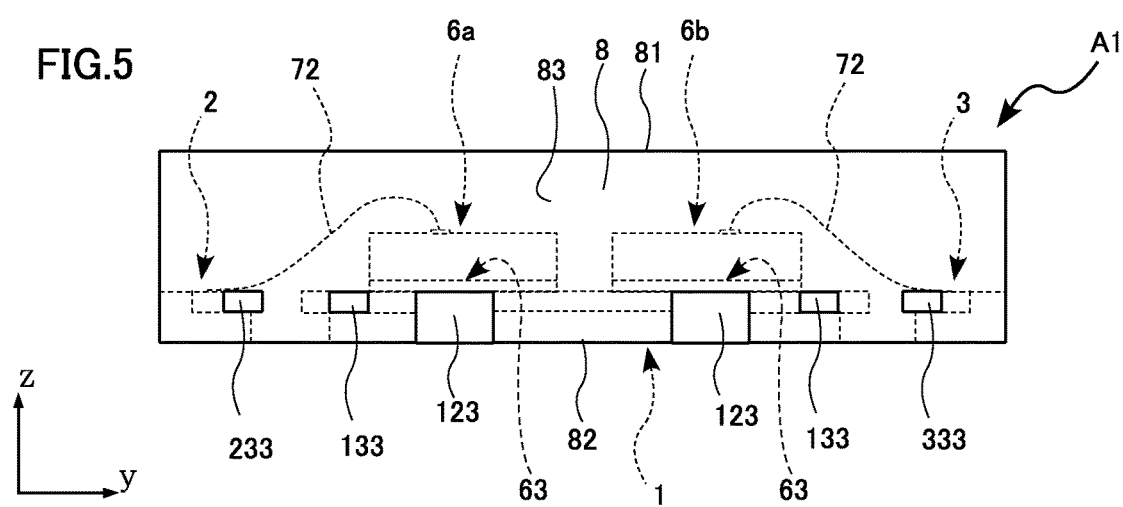
FIG. 5 is a right side view of the semiconductor device shown in FIG. 1.
Figure 6:
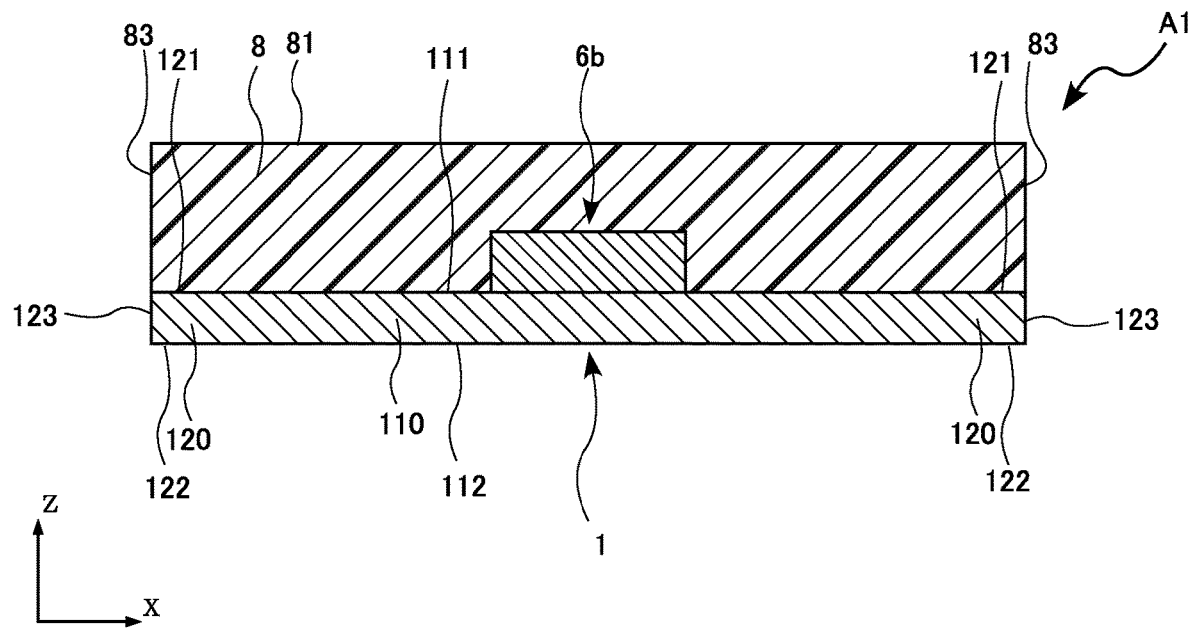
FIG. 6 is a sectional view taken along line VI-VI of FIG. 2.
Figure 7:
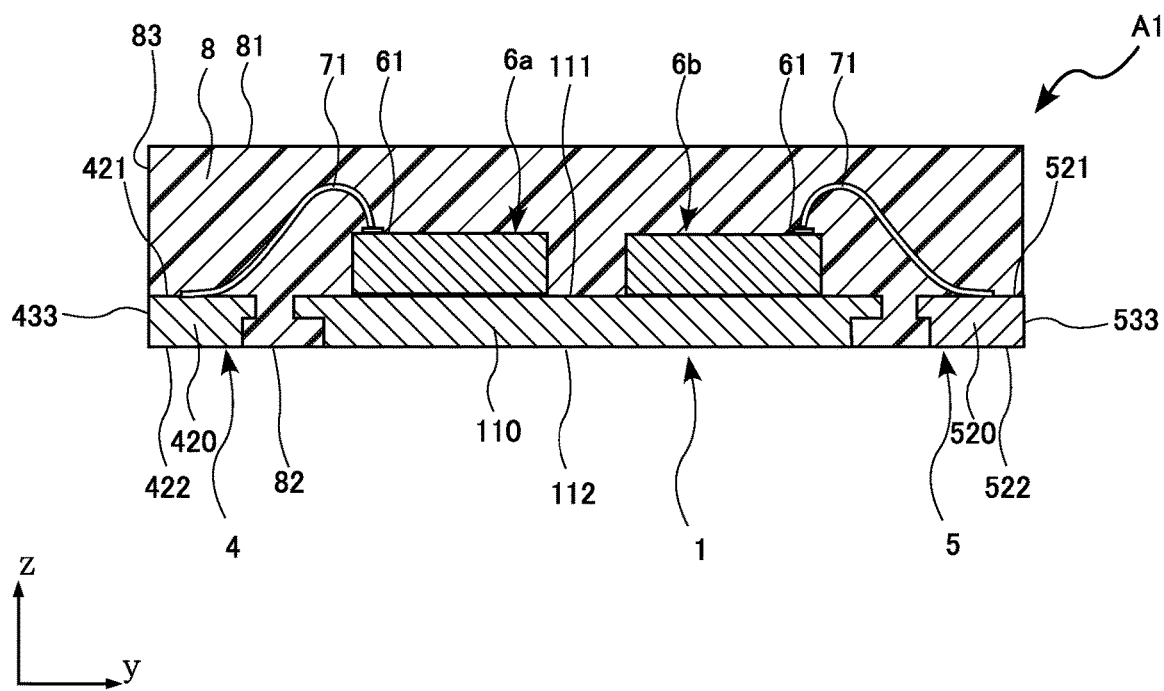
FIG. 7 is a sectional view taken along line VII-VII of FIG. 2.

FIG. 1 is a perspective view of the semiconductor device A1. FIG. 2 is a plan view of the semiconductor device A1. In FIG. 2, the sealing resin 8 is shown in phantom lines (chain double-dashed line) representing the contour of the sealing resin 8. FIG. 3 is a front view of the semiconductor device A1. FIG. 4 is a bottom view of the semiconductor device A1. FIG. 5 is a right side view of the semiconductor device A1. FIG. 6 is a sectional view taken along line VI-VI of FIG. 2. FIG. 7 is a sectional view taken along line VII-VII of FIG. 2.

The semiconductor device A1 is for surface mounting on a circuit board, for example. The semiconductor device A1 is rectangular as viewed in the thickness direction (as seen in plan view). For purpose of description, the thickness direction of the semiconductor device A1 is defined as z direction. A direction perpendicular to the z direction and parallel to an edge of the semiconductor device A1 (the horizontal direction in FIG. 2) is defined as x direction. The direction perpendicular to the z and x directions (the vertical direction in FIG. 2) is defined as y direction. The size of the semiconductor device A1 is not specifically limited. In the present embodiment, the semiconductor device A1 is about 1 to 10 mm in the x direction, 1 to 10 mm in the y direction, and 0.3 to 3 mm in the z direction.

The leads 1 to 5 may support the semiconductor element 6 (6a and 6b) or may be electrically connected to the semiconductor element 6 (6a or 6b). The leads 1 to 5 are formed from a metal plate processed by punching or bending, for example. The leads 1 to 5 are made of a metal, which is preferably Cu, Ni, an alloy of Cu and Ni, or Alloy 42. In the present embodiment, the leads 1 to 5 are made of Cu. The thickness of the leads 1 to 5 may be from 0.08 to 0.5 min, and in the present embodiment, it is about 0.125 mm. In the following description, the leads 1 to 5 may be referred to individually as a first lead 1, a second lead 2, a third lead 3, a fourth lead 4 and a fifth lead 5.

As shown in FIG. 2, the first lead 1 is located at the center the semiconductor device A1 in the y direction and extends from one side to the other in the x direction. The second lead 2 and the third lead 3 are at the opposite sides of the first lead 1 in the y direction and spaced apart from the first lead 1. The fourth lead 4 and the fifth lead 5 are at the opposite sides of the first lead 1 in the y direction and spaced apart from the first lead 1. The second lead 2 and the fourth lead 4 are at the same side of the first lead 1 in the y direction (the lower side in FIG. 2) and spaced apart from each other in the x direction. The third lead 3 and the fifth lead 5 are located at the same side of the first lead 1 in the y direction (the upper side in FIG. 2) and spaced apart from each other in the x direction. As viewed in the z direction, the first lead 1 is the largest, and the fourth lead 4 and the fifth lead 5 are the smallest.

The first lead 1 includes a mounting portion 110, first-lead terminal portions 120 and a first-lead connecting portion 130.

The mounting portion 110 is generally rectangular and located at the center of the first lead 1 as viewed in the z direction. The mounting portion 110 has a mounting-portion front surface 111 and a mounting-portion back surface 112. The mounting-portion front surface 111 and the mounting-portion back surface 112 face opposite to each other in the z direction. The mounting-portion front surface 111 faces upward in FIGS. 3 and 5. The mounting-portion front surface 111 is where the semiconductor element 6 is mounted. The mounting-portion back surface 112 faces downward in FIGS. 3 and 5. The mounting-portion back surface 112 is exposed from the sealing resin 8 and serves as a back surface terminal.

Each first-lead terminal portion 120 is connected to the mounting portion 110 and rectangular as viewed in the z direction. In this embodiment, two first-lead terminal portions 120 are provided on either end face of the mounting portion 110 in the x direction, such that each first-lead terminal portion 120 is located between an end and the center in the y direction. That is, a total of four first-lead terminal portions 120 are provided. Each first-lead terminal portion 120 has a first-lead-terminal-portion front surface 121, a first-lead-terminal-portion back surface 122 and a first-lead-terminal-portion end face 123. The first-lead-terminal-portion front surface 121 and the first-lead-terminal-portion back surface 122 face opposite to each other in the z direction. The first-lead-terminal-portion front surface 121 faces upward in FIGS. 3 and 5. The first-lead-terminal-portion front surface 121 is flush with the mounting-portion front surface 111. The first-lead-terminal-portion back surface 122 faces downward in FIGS. 3 and 5. The first-lead-terminal-portion back surface 122 is flush with the mounting-portion back surface 112. The first-lead-terminal-portion end face 123 is a surface facing outward in the x direction and connecting the first-lead-terminal-portion front surface 121 and the first-lead-terminal-portion back surface 122. The first-lead-terminal-portion back surface 122 and the first-lead-terminal-portion end face 123 are exposed from the sealing resin 8 and connected to form a terminal (see FIG. 6).

The first-lead connecting portion 130 is connected to the mounting portion 110 so as to surround the mounting portion 110 as viewed in the z direction. The first-lead connecting portion 130 has a thickness (i.e., the dimension in the z direction) that is about half the thickness of the mounting portion 110. The first-lead connecting portion 130 is formed by, for example, half etching. The first-lead connecting portion 130 has a first-lead-connecting-portion front surface 131, a first-lead-connecting-portion back surface 132 and first-lead-connecting-portion end faces 133. The first-lead-connecting-portion front surface 131 and the first-lead-connecting-portion back surface 132 face opposite to each other in the z direction. The first-lead-connecting-portion front surface 131 faces upward in FIGS. 3 and 5. The first-lead-connecting-portion front surface 131 is flush with the mounting-portion front surface 111. That is, the mounting-portion front surface 111, the first-lead-terminal-portion front surface 121 and the first-lead-connecting-portion front surface 131 form one planar surface (see FIG. 2). The first-lead-connecting-portion back surface 132 faces downward in FIGS. 3 and 5. The first-lead connecting portion 130 has four projections projecting outward in the x direction. As viewed in the z direction, two projections are provided on either side surface of the first-lead connecting portion 130 facing outward in the x direction, such that each projection is located between an end in the y direction and the first-lead terminal portion 120 nearest to the end. Each first-lead-connecting-portion end face 133 is the end face of a projection facing in the x direction and connecting the first-lead-connecting-portion front surface 131 and the first-lead-connecting-portion back surface 132. The first-lead-connecting-portion end faces 133 are exposed from the sealing resin 8.

The first lead 1 has a surface plating layer (not shown) on all the surfaces exposed from the sealing resin 8. In the present embodiment, the surface plating layer is provided on the mounting-portion back surface 112, the first-lead-terminal-portion back surfaces 122, the first-lead-terminal-portion end faces 123 and the first-lead-connecting-portion end faces 133. The surface plating layer is made of a material having better solder wettability than the base material of the first lead 1. In the present embodiment, the surface plating layer is made of Au, for example. The surface plating layer is deposited by electroless displacement plating in a manufacturing method, which will be described later.

The second lead 2 is located at a corner (lower right in FIG. 2) of the semiconductor device A1 as viewed in the z direction and includes a wire bonding portion 210, three second-lead terminal portions 220 and a second-lead connecting portion 230.

As viewed in the z direction, the wire bonding portion 210 is located generally at the center of the second lead 2 in the y direction and has a rectangle shape that is long in the x direction. The wire bonding portion 210 has a wire-bonding-portion front surface 211 and a wire-bonding-portion back surface 212. The wire-bonding-portion front surface 211 and the wire-bonding-portion back surface 212 face opposite to each other in the z direction. The wire-bonding-portion front surface 211 faces upward in FIGS. 3 and 5. The wirebonding-portion front surface 211 is where bonding wires 72 are bonded. The wire-bonding-portion back surface 212 faces downward in FIGS. 3 and 5.

Each second-lead terminal portion 220 is connected to the wire bonding portion 210 and rectangular as viewed in the z direction. The three second-lead terminal portions 220 are arranged side by side on one of the end faces of the wire bonding portion 210 in the y direction (the end face facing outside of the semiconductor device A1). Each second-lead terminal portion 220 has a second-lead-terminal-portion front surface 221, a second-lead-terminal-portion back surface 222 and a second-lead-terminal-portion end face 223. The second-lead-terminal-portion front surface 221 and the second-lead-terminal-portion back surface 222 face opposite to each other in the z direction. The second-lead-terminal-portion front surface 221 faces upward in FIGS. 3 and 5. The second-lead-terminal-portion front surface 221 is flush with the wire-bonding-portion front surface 211. The second-lead-terminal-portion back surface 222 faces downward in FIGS. 3 and 5. The second-lead-terminal-portion back surface 222 is flush with the wire-bonding-portion back surface 212. The second-lead-terminal-portion end face 223 is a surface facing outward in the y direction and connecting the second-lead-terminal-portion front surface 221 and the second-lead-terminal-portion back surface 222. The wire-bonding-portion back surface 212, the second-lead-terminal-portion back surfaces 222 and the second-lead-terminal-portion end faces 223 are exposed from the sealing resin 8 and connected to form a terminal.

The second-lead connecting portion 230 is connected to the wire bonding portion 210 so as to surround the wire bonding portion 210 as viewed in the z direction. The second-lead connecting portion 230 has a thickness (i.e., the dimension in the z direction) that is about half the thickness of the wire bonding portion 210. The second-lead connecting portion 230 is formed by, for example, half etching. The second-lead connecting portion 230 has a second-lead-connecting-portion front surface 231, a second-lead-connecting-portion back surface 232 and a second-lead-connecting-portion end face 233. The second-lead-connecting-portion front surface 231 and the second-lead-connecting-portion back surface 232 face opposite to each other in the z direction. The second-lead-connecting-portion front surface 231 faces upward in FIGS. 3 and 5. The second-lead-connecting-portion front surface 231 is flush with the wire-bonding-portion front surface 211. That is, the wire-bonding-portion front surface 211, the second-lead-terminal-portion front surfaces 221 and the second-lead-connecting-portion front surface 231 form one continuous planar surface (see FIG. 2). The second-lead-connecting-portion back surface 232 faces downward in FIGS. 3 and 5. The second-lead connecting portion 230 has a projection projecting in the x direction (to the right in FIG. 2). The second-lead-connecting-portion end face 233 is the end face of the projection facing in the x direction and connecting the second-lead-connecting-portion front surface 231 and the second-lead-connecting-portion back surface 232. The second-lead-connecting-portion end face 233 is exposed from the sealing resin 8.

The second lead 2 has a surface plating layer (not shown) on all the surfaces exposed from the sealing resin 8. In the present embodiment, the surface plating layer is provided on the wire-bonding-portion back surface 212, the second-lead-terminal-portion back surfaces 222, the second-lead-terminal-portion end faces 223 and the second-lead-connecting-portion end face 233. The surface plating layer is similar to the surface plating layer of the first lead 1 in that it is made of, for example, Au and deposited by electroless displacement plating.

The third lead 3 is located at a corner (upper right in FIG. 2) of the semiconductor device A1 as viewed in the z direction and includes a wire bonding portion 310, three third-lead terminal portions 320 and a third-lead connecting portion 330.

As viewed in the z direction, the wire bonding portion 310 is located generally at the center of the third lead 3 and has a rectangle shape that is long in the x direction. The wire bonding portion 310 has a wire-bonding-portion front surface 311 and a wire-bonding-portion back surface 312. The wire-bonding-portion front surface 311 and the wire-bonding-portion back surface 312 face opposite to each other in the z direction. The wire-bonding-portion front surface 311 faces upward in FIGS. 3 and 5. The wire-bonding-portion front surface 311 is where bonding wires 72 are bonded. The wire-bonding-portion back surface 312 faces downward in FIGS. 3 and 5.

Each third-lead terminal portion 320 is connected to the wire bonding portion 310 and rectangular as viewed in the z direction. The three third-lead terminal portion 320 are arranged side by side on one of the end faces of the wire bonding portion 310 in the y direction (the end face facing outside of the semiconductor device A1). Each third-lead terminal portion 320 has a third-lead-terminal-portion front surface 321, a third-lead-terminal-portion back surface 322 and a third-lead-terminal-portion end face 323. The third-lead-terminal-portion front surface 321 and the third-lead-terminal-portion back surface 322 face opposite to each other in the z direction. The third-lead-terminal-portion front surface 321 faces upward in FIGS. 3 and 5. The third-lead-terminal-portion front surface 321 is flush with the wire-bonding-portion front surface 311. The third-lead-terminal-portion back surface 322 faces downward in FIGS. 3 and 5. The third-lead-terminal-portion back surface 322 is flush with the wire-bonding-portion back surface 312. The third-lead-terminal-portion end face 323 is a surface facing outward in the y direction and connecting the third-lead-terminal-portion front surface 321 and the third-lead-terminal-portion back surface 322. The wire-bonding-portion back surface 312, the third-lead-terminal-portion back surface 322 and the third-lead-terminal-portion end face 323 are exposed from the sealing resin 8 and connected to form a terminal.

The third-lead connecting portion 330 is connected to the wire bonding portion 310 so as to surround the wire bonding portion 310 as viewed in the z direction. The third-lead connecting portion 330 has a thickness (i.e., the dimension in the z direction) that is about half the thickness of the wire bonding portion 310. The third-lead connecting portion 330 is formed by, for example, half etching. The third-lead connecting portion 330 has a third-lead-connecting-portion front surface 331, a third-lead-connecting-portion back surface 332 and a third-lead-connecting-portion end face 333. The third-lead-connecting-portion front surface 331 and the third-lead-connecting-portion back surface 332 face opposite to each other in the z direction. The third-lead-connecting-portion front surface 331 faces upward in FIGS. 3 and 5. The third-lead-connecting-portion front surface 331 is flush with the wire-bonding-portion front surface 311. That is, the wire-bonding-portion front surface 311, the third-lead-terminal-portion front surfaces 321 and the third-lead-connecting-portion front surface 331 form one continuous planar surface (see FIG. 2). The third-lead-connecting-portion back surface 332 faces downward in FIGS. 3 and 5.

The third-lead connecting portion 330 has a projection projecting in the x direction (to the right in FIG. 2). The third-lead-connecting-portion end face 333 is the end face of the projection facing in the x direction and connecting the third-lead-connecting-portion front surface 331 and the third-lead-connecting-portion back surface 332. The third-lead-connecting-portion end face 333 is exposed from the sealing resin 8.

The third lead 3 has a surface plating layer (not shown) on all the surfaces exposed from the sealing resin 8. In the present embodiment, the surface plating layer is provided on the wire-bonding-portion back surface 312, the third-lead-terminal-portion back surfaces 322, the third-lead-terminal-portion end faces 323 and the third-lead-connecting-portion end face 333. The surface plating layer is similar to the surface plating layer of the first lead 1 in that it is made of, for example, Au and deposited by electroless displacement plating.

The fourth lead 4 is located at a corner (lower left in FIG. 2) of the semiconductor device A1 as viewed in the z direction and includes a fourth-lead terminal portion 420 and a fourth-lead connecting portion 430.

The fourth-lead terminal portion 420 is rectangular as viewed in z direction. The fourth-lead terminal portion 420 has a fourth-lead-terminal-portion front surface 421, a fourth-lead-terminal-portion back surface 422 and a fourth-lead-terminal-portion end face 423. The fourth-lead-terminal-portion front surface 421 and the fourth-lead-terminal-portion back surface 422 face opposite to each other in the z direction. The fourth-lead-terminal-portion front surface 421 faces upward in FIGS. 3 and 5. The fourth-lead-terminal-portion front surface 421 is where a bonding wire 71 is bonded. The fourth-lead-terminal-portion back surface 422 faces downward in FIGS. 3 and 5. The fourth-lead-terminal-portion end face 423 is a surface facing outward in the y direction and connecting the fourth-lead-terminal-portion front surface 421 and the fourth-lead-terminal-portion back surface 422. The fourth-lead-terminal-portion back surface 422 and the fourth-lead-terminal-portion end face 423 are exposed from the sealing resin 8 and connected to form a terminal.

The fourth-lead connecting portion 430 is connected to the fourth-lead terminal portion 420 so as to surround the fourth-lead terminal portion 420 as viewed in the z direction. The fourth-lead connecting portion 430 has a thickness (i.e., the dimension in the z direction) that is about half the thickness of the fourth-lead terminal portion 420. The fourth-lead connecting portion 430 is formed by, for example, half etching. The fourth-lead connecting portion 430 has a fourth-lead-connecting-portion front surface 431, a fourth-lead-connecting-portion back surface 432 and a fourth-lead-connecting-portion end face 433. The fourth-lead-connecting-portion front surface 431 and the fourth-lead-connecting-portion back surface 432 face opposite to each other in the z direction. The fourth-lead-connecting-portion front surface 431 faces upward in FIGS. 3 and 5. The fourth-lead-connecting-portion front surface 431 and the fourth-lead-terminal-portion front surface 421 form one continuous planar surface (see FIG. 2). The fourth-lead-connecting-portion back surface 432 faces downward in FIGS. 3 and 5. The fourth-lead connecting portion 430 has a projection projecting in the x direction (to the left in FIG. 2). The fourth-lead-connecting-portion end face 433 is the end face of the projection facing in the x direction and connecting the fourth-lead-connecting-portion front surface 431 and the fourth-lead-connecting-portion back surface 432. The fourth-lead-connecting-portion end face 433 is exposed from the sealing resin 8.

The fourth lead 4 has a surface plating layer (not shown) on all the surfaces exposed from the sealing resin 8. In the present embodiment, a surface plating is provided on the fourth-lead-terminal-portion back surface 422, the fourth-lead-terminal-portion end face 423 and the fourth-lead-connecting-portion end face 433. The surface plating layer is similar to the surface plating layer of the first lead 1 in that it is made of, for example, Au and deposited by electroless displacement plating.

The fifth lead 5 is located at a corner (upper left in FIG. 2) of the semiconductor device A1 as viewed in the z direction and includes a fifth-lead terminal portion 520 and a fifth-lead connecting portion 530.

The fifth-lead terminal portion 520 is rectangular as viewed in z direction. The fifth-lead terminal portion 520 has a fifth-lead-terminal-portion front surface 521, a fifth-lead-terminal-portion back surface 522 and a fifth-lead-terminal-portion end face 523. The fifth-lead-terminal-portion front surface 521 and the fifth-lead-terminal-portion back surface 522 face opposite to each other in the z direction. The fifth-lead-terminal-portion front surface 521 faces upward in FIGS. 3 and 5. The fifth-lead-terminal-portion front surface 521 is where a bonding wire 71 is bonded. The fifth-lead-terminal-portion back surface 522 faces downward in FIGS. 3 and 5. The fifth-lead-terminal-portion end face 523 is a surface facing outward in the y direction and connecting the fifth-lead-terminal-portion front surface 521 and the fifth-lead-terminal-portion back surface 522. The fifth-lead-terminal-portion back surface 522 and the fifth-lead-terminal-portion end face 523 are exposed from the sealing resin 8 and connected to form a terminal.

The fifth-lead connecting portion 530 is connected to the fifth-lead terminal portion 520 so as to surround the fifth-lead terminal portion 520 as viewed in the z direction. The fifth-lead connecting portion 530 has a thickness (i.e., the dimension in the z direction) that is about half the thickness of the fifth-lead terminal portion 520. The fifth-lead connecting portion 530 is formed by, for example, half etching. The fifth-lead connecting portion 530 has a fifth-lead-connecting-portion front surface 531, a fifth-lead-connecting-portion back surface 532 and a fifth-lead-connecting-portion end face 533. The fifth-lead-connecting-portion front surface 531 and the fifth-lead-connecting-portion back surface 532 face opposite to each other in the z direction. The fifth-lead-connecting-portion front surface 531 faces upward in FIGS. 3 and 5. The fifth-lead-connecting-portion front surface 531 and the fifth-lead-terminal-portion front surface 521 form one continuous planar surface (see FIG. 2). The fifth-lead-connecting-portion back surface 532 faces downward in FIGS. 3 and 5. The fifth-lead connecting portion 530 has a projection projecting in the x direction (to the left in FIG. 2). The fifth-lead-connecting-portion end face 533 is the end face of the projection facing in the x direction and connecting the fifth-lead-connecting-portion front surface 531 and the fifth-lead-connecting-portion back surface 532. The fifth-lead-connecting-portion end face 533 is exposed from the sealing resin 8.

The fifth lead 5 has a surface plating layer (not shown) on all the surfaces exposed from the sealing resin 8. In the present embodiment, a surface plating layer is provided on the fifth-lead-terminal-portion back surface 522, the fifth-lead-terminal-portion end face 523 and the fifth-lead-connecting-portion end face 533. The surface plating layer is similar to the surface plating layer of the first lead 1 in that it is made of, for example, Au and deposited by electroless displacement plating.

The semiconductor element 6 is an element by which the electrical function of the semiconductor device A1 is achieved. The semiconductor element 6 is not limited to any particular type. In the present embodiment, the semiconductor element 6 is a transistor, such as a metal-oxide-semiconductor field-effect transistor (MOSFET). The semiconductor element 6 includes an element body 60, a first electrode 61, a second electrode 62 and a third electrode 63.

The first electrode 61 and the second electrode 62 are disposed on the surface of the element body 60 facing away from the first lead 1. As shown in FIG. 5, the third electrode 63 is disposed on the surface of the element body 60 facing the first lead 1. In the present embodiment, the first electrode 61 comprises a gate electrode, the second electrode 62 comprises a source electrode, and the third electrode 63 comprises a drain electrode.

In the present embodiment, the semiconductor device A1 includes two semiconductor elements 6. The two semiconductor elements 6 are located next to each other in the y direction on the first lead 1. In the following description, the semiconductor element 6 located toward the second lead 2 and the fourth lead 4 is designated as a semiconductor element 6a, and the semiconductor element 6 located toward the third lead 3 and the fifth lead 5 is designated as a semiconductor element 6b. When it is not necessary to separately identify the semiconductor elements 6a and 6b, they may be collectively referred to as the semiconductor elements 6.

The semiconductor element 6a is attached to the mounting-portion front surface 111 of the first lead 1 with an electrically conductive bonding material (not shown). Thus, the third electrode 63 of the semiconductor element 6a is electrically connected to the first lead 1 via the bonding material. A bonding wire 71 is connected to the first electrode 61 of the semiconductor element 6a and the fourth-lead-terminal-portion front surface 421 of the fourth lead 4. Thus, the first electrode 61 of the semiconductor element 6a is electrically connected to the fourth lead 4. A plurality of bonding wires 72 are connected to the second electrode 62 of the semiconductor element 6a and the wire-bonding-portion front surface 211 of the second lead 2. Thus, the second electrode 62 of the semiconductor element 6a is electrically connected to the second lead 2.

The semiconductor element 6b is attached to the mounting-portion front surface 111 of the first lead 1 with an electrically conductive bonding material (not shown). Thus, the third electrode 63 of the semiconductor element 6b is electrically connected to the first lead 1 via the bonding material. A bonding wire 71 is connected to the first electrode 61 of the semiconductor element 6b and the fifth-lead-terminal-portion front surface 521 of the fifth lead 5. Thus, the first electrode 61 of the semiconductor element 6b is electrically connected to the fifth lead 5. A plurality of bonding wires 72 are connected to the second electrode 62 of the semiconductor element 6b and the wire-bonding-portion front surface 311 of the third lead 3. Thus, the second electrode 62 of the semiconductor element 6b is electrically connected to the third lead 3.

Note that the semiconductor elements 6 and their connection to the leads 1 to 5 described above are merely an example. The number, type and arrangement of the semiconductor elements 6 are not specifically limited, and their wiring pattern is not limited either.

The sealing resin 8 covers the semiconductor elements 6a and 6b, the bonding wires 71 and 72, and a portion of each of the leads 1 to 5. The sealing resin 8 may be made of a black epoxy resin, for example.

The sealing resin 8 has a resin front surface 81, a resin back surface 82 and resin side surfaces 83. The resin front surface 81 and the resin back surface 82 face opposite to each other in the z direction. The resin front surface 81 faces upward in FIGS. 3 and 5, and the resin back surface 82 faces downward in FIGS. 3 and 5. The resin side surfaces 83 connect the resin front surface 81 and the resin back surface 82 and face either in the x direction or in the y direction.

In the present embodiment, the first-lead-terminal-portion end faces 123 and the first-lead-connecting-portion end faces 133 of the first lead 1, the second-lead-terminal-portion end faces 223 and the second-lead-connecting-portion end face 233 of the second lead 2, the third-lead-terminal-portion end faces 323 and the third-lead-connecting-portion end face 333 of the third lead 3, the fourth-lead-terminal-portion end face 423 and the fourth-lead-connecting-portion end face 433 of the fourth lead 4, and the fifth-lead-terminal-portion end face 523 and the fifth-lead-connecting-portion end face 533 of the fifth lead 5 are each flush with one of the resin side surfaces 83 of the sealing resin 8. In addition, the mounting-portion back surface 112 and the first-lead-terminal-portion back surfaces 122 of the first lead 1, the wire-bonding-portion back surface 212 and the second-lead-terminal-portion back surfaces 222 of the second lead 2, the wire-bonding-portion back surface 312 and the third-lead-terminal-portion back surfaces 322 of the third lead 3, the fourth-lead-terminal-portion back surface 422 of the fourth lead 4, and the fifth-lead-terminal-portion back surface 522 of the fifth lead 5 are all flush with the resin back surface 82 of the sealing resin 8.

As shown in FIGS. 3 and 5, the first-lead-terminal-portion end faces 123, the second-lead-terminal-portion end faces 223, the third-lead-terminal-portion end faces 323, the fourth-lead-terminal-portion end face 423 and the fifth-lead-terminal-portion end face 523 are all connected to the resin back surface 82 of the sealing resin 8. In contrast, as shown in FIG. 5, the first-lead-connecting-portion end faces 133, the second-lead-connecting-portion end face 233, the third-lead-connecting-portion end face 333, the fourth-lead-connecting-portion end face 433 and the fifth-lead-connecting-portion end face 533 are all spaced apart from the resin back surface 82 of the sealing resin 8.

Figure 8:
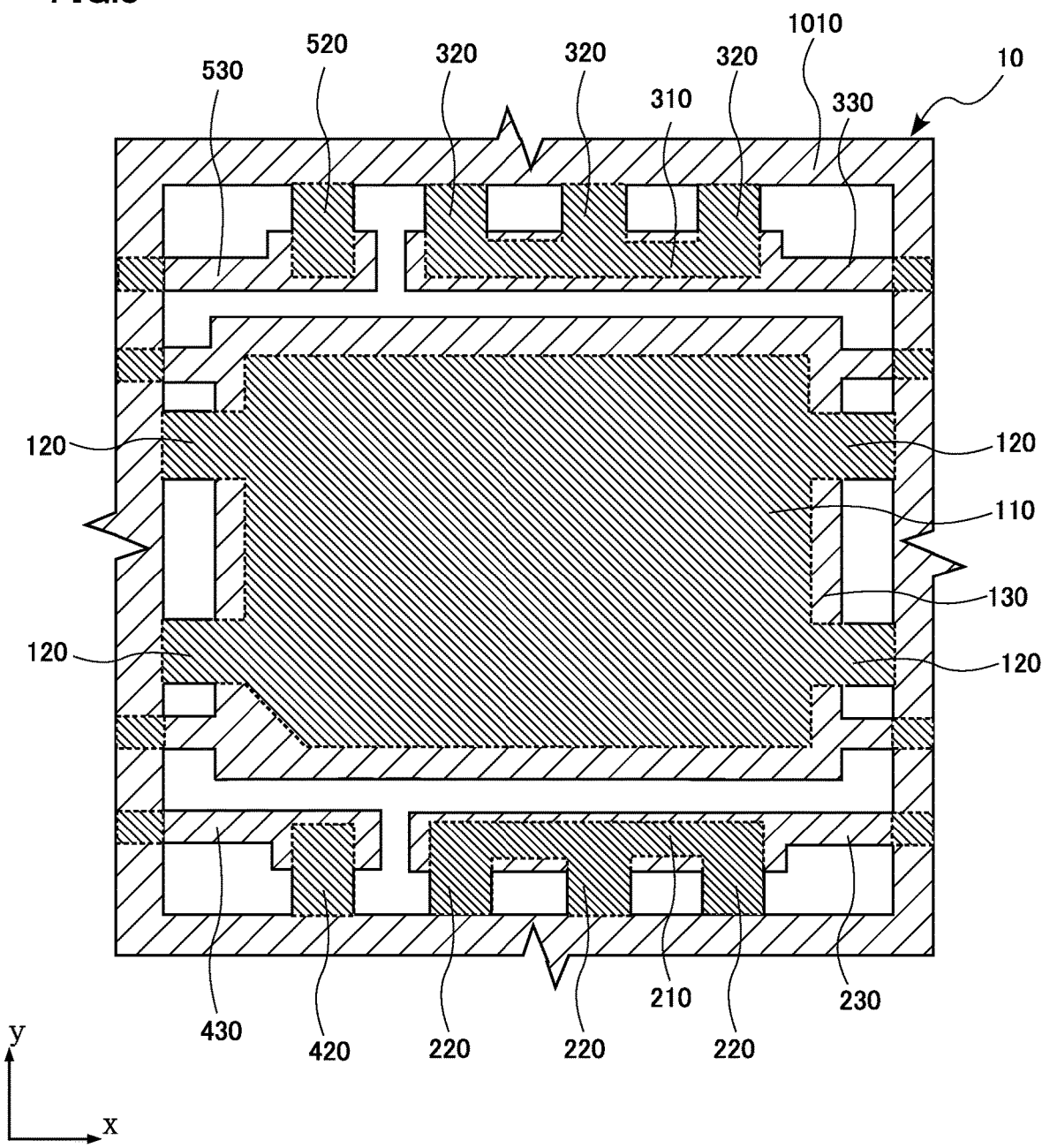
FIG. 8 is a plan view illustrating a manufacturing step of the semiconductor device shown in FIG. 1.
Figure 9:
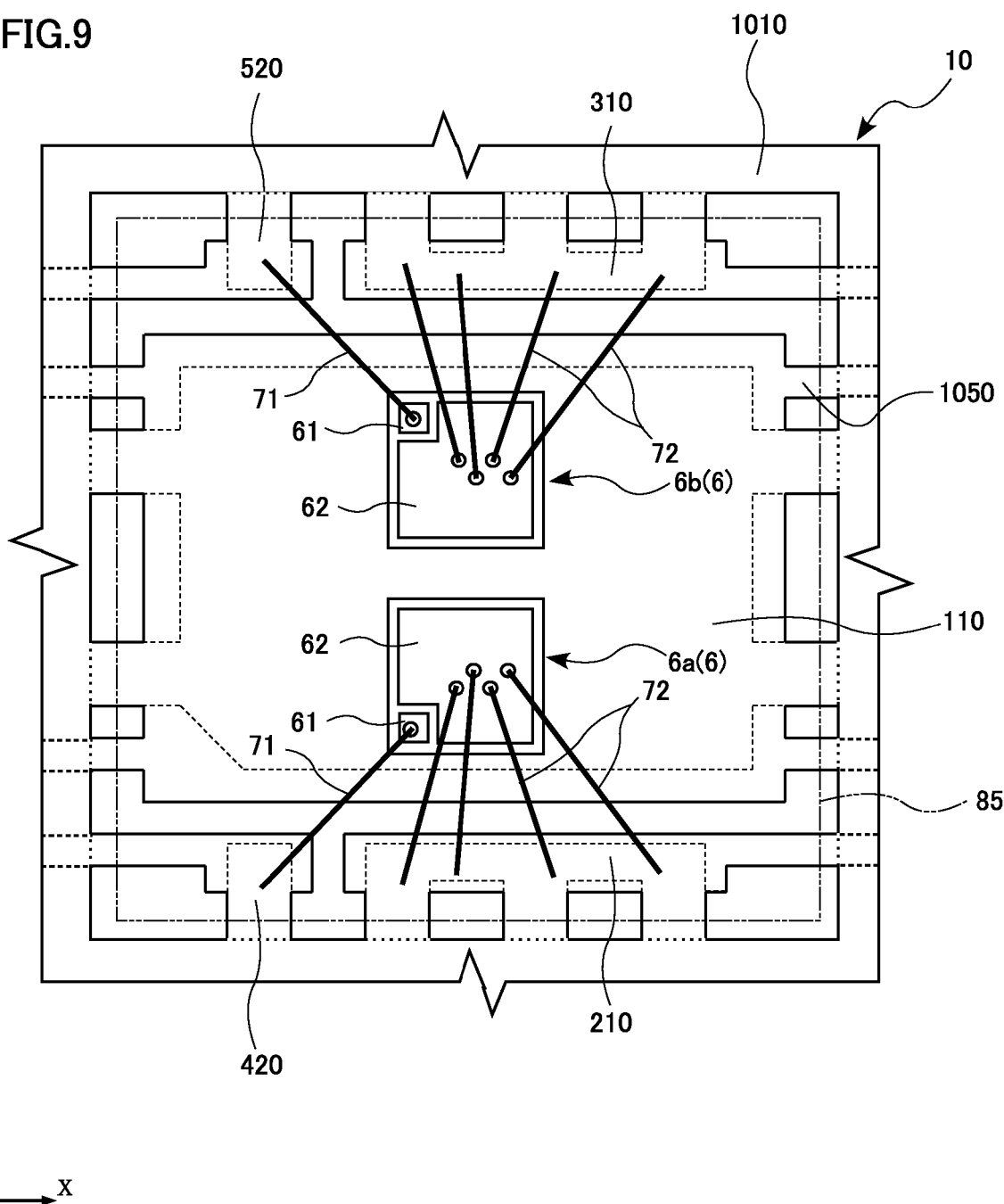
FIG. 9 is a plan view illustrating a manufacturing step of the semiconductor device shown in FIG. 1.

The following describes a method for manufacturing a semiconductor device A1 with reference to FIGS. 8 and 9. These figures are plan views in which the x direction, the y direction and the z direction correspond to those in FIG. 2.

First, a lead frame 10 is prepared, as shown in FIG. 8. The lead frame 10 is a plate-like material from which the leads 1 to 5 will be formed. The lead frame 10 has a front surface 1010, which will form the mounting-portion front surface 111, first-lead-terminal-portion front surfaces 121, first-lead-connecting-portion front surface 131, wire-bonding-portion front surface 211, second-lead-terminal-portion front surfaces 221, second-lead-connecting-portion front surface 231, wire-bonding-portion front surface 311, third-lead-terminal-portion front surfaces 321, third-lead-connecting-portion front surface 331, fourth-lead-terminal-portion front surface 421, fourth-lead-connecting-portion front surface 431, fifth-lead-terminal-portion front surface 521 and fifth-lead-connecting-portion front surface 531. The front surface 1010 of the lead frame 10 is planar. In FIG. 8, hatched regions with closely spaced lines are where the thickness (z-direction dimension) is larger and correspond to the mounting portion 110, first-lead terminal portions 120, wire bonding portion 210, second-lead terminal portions 220, wire bonding portion 310, third-lead terminal portions 320, fourth-lead terminal portion 420 and fifth-lead terminal portion 520. In contrast, hatched areas with widely spaced lines are where the thickness (z-direction dimension) is smaller and correspond to the first-lead connecting portion 130, second-lead connecting portion 230, third-lead connecting portion 330, fourth-lead connecting portion 430 and fifth-lead connecting portion 530. Those thinner regions are formed by half etching, for example. In the present embodiment, the base material of the lead frame 10 contains Cu.

Next, as shown in FIG. 9, the semiconductor elements 6a and 6b are bonded to the mounting portion 110 of the lead frame 10 with an electrically conductive bonding material. Then, a bonding wire 71 is bonded to the first electrode 61 of the semiconductor element 6a and the fourth-lead terminal portion 420, and a plurality of bonding wires 72 are bonded to the second electrode 62 of the semiconductor element 6a and the wire bonding portion 210 of the second lead 2. Similarly, a bonding wire 71 is bonded to the first electrode 61 of the semiconductor element 6b and the fifth-lead terminal portion 520 of the fifth lead 5, and a plurality of bonding wires 72 are bonded to the second electrode 62 of the semiconductor element 6b and the wire bonding portion 310 of the third lead 3.

Then, the sealing resin 8 (not shown) is formed by curing a resin material, so as to cover the semiconductor elements 6a and 6b, the bonding wires 71 and 72, and a portion of the lead frame 10. In the present embodiment, the sealing resin 8 is formed on the entire region shown in FIG. 9. Then, the lead frame 10 and the sealing resin 8 are cut along cut lines 85. This separates a chip that will be the semiconductor device A1.

Next, the separated chip is processed to form a surface plating layer on the leads 1 to 5 to cover their surfaces exposed from the sealing resin 8. The surface plating layer may be deposited by immersing the chip in a plating solution to cause electroless displacement plating. As a result, a surface plating layer is deposited on the mounting-portion back surface 112, first-lead-terminal-portion back surfaces 122, first-lead-terminal-portion end faces 123, first-lead-connecting-portion end faces 133, wire-bonding-portion back surface 212, second-lead-terminal-portion back surfaces 222, second-lead-terminal-portion end faces 223, second-lead-connecting-portion end face 233, wire-bonding-portion back surface 312, third-lead-terminal-portion back surfaces 322, third-lead-terminal-portion end faces 323, third-lead-connecting-portion end face 333, fourth-lead-terminal-portion back surface 422, fourth-lead-terminal-portion end face 423, fourth-lead-connecting-portion end face 433, fifth-lead-terminal-portion back surface 522, fifth-lead-terminal-portion end face 523 and fifth-lead-connecting-portion end face 533. Note that the process of electroless displacement plating stops when base ions on the leads 1 to 5 are replaced by ions in the solution to form a plating layer. That is, by electroless displacement plating, the surface plating layer cannot be deposited to such a thickness that would significantly increase the height of the surfaces of the leads 1 to 5. Therefore, although the surface plating layer is added, the end faces of the leads 1 to 5 are maintained flush with a resin side surface 83 and the back surfaces of the leads 1 to 5 are maintained flush with the resin back surface 82.

The semiconductor device A1 is obtained through the steps described above.

The following describes advantages of the semiconductor device A1.

In the present embodiment, the first lead 1 includes the mounting portion 110 on which the semiconductor elements 6a and 6b are mounted and the first-lead terminal portions 120 exposed from the sealing resin 8 and serving as terminals. Each first-lead terminal portion 120 includes a first-lead-terminal-portion end face 123 exposed from the resin side surface 83 and a first-lead-terminal-portion back surface 122 exposed from the resin back surface 82. The first-lead-terminal-portion end face 123 and the first-lead-terminal-portion back surface 122 are connected to form a terminal (see FIG. 6). To mount the semiconductor device A1 on a circuit board, the terminals are soldered to circuit wiring on the circuit board. As a result of soldering, solder fillets form on the first-lead-terminal-portion end faces 123, indicating that the first-lead terminal portions 120 are joined to the circuit wiring. Thus, it is possible to visually confirm the bonding condition of the first lead 1 based on the post-mounting appearance of the product.

Figure 10:
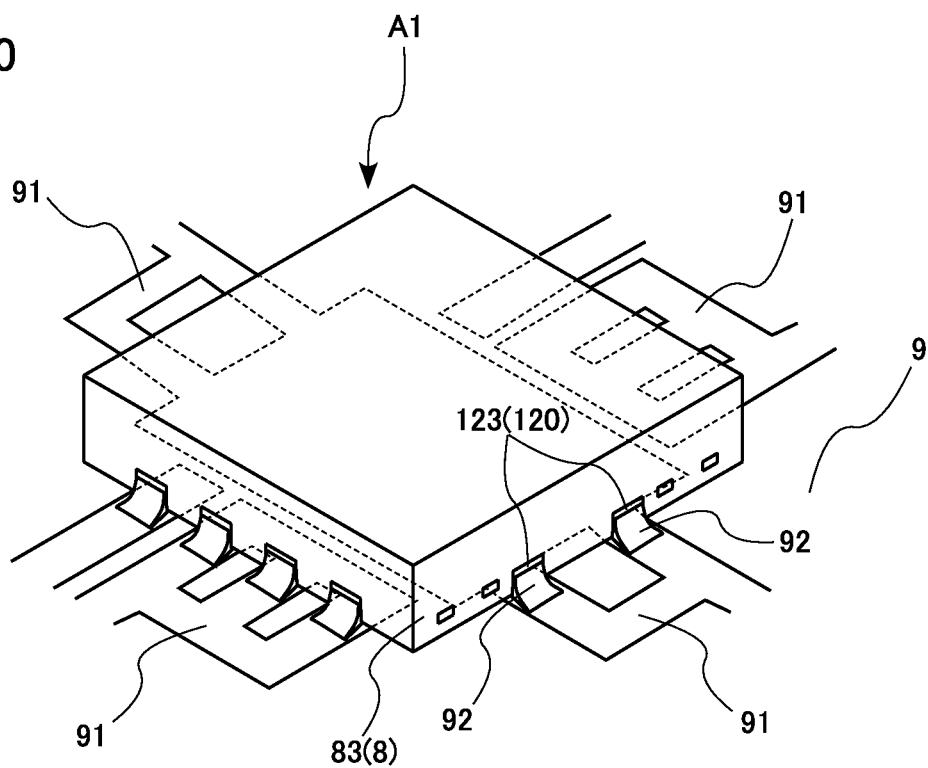
FIG. 10 is a perspective view of the semiconductor device of FIG. 1 mounted on a circuit board.

FIG. 10 is a perspective view illustrating the semiconductor device A1 mounted on the circuit board 9. As shown, the semiconductor device A1 is placed on the circuit board 9 and each terminal is soldered to circuit wiring 91 formed on the circuit board 9. With the semiconductor device A1, the first-lead terminal portions 120 are exposed from the sealing resin 8 and used as terminals, and they are joined to the circuit wiring 91 by soldering. As a result, a solder fillet 92 forms between each first-lead-terminal-portion end face 123 and the circuit wiring 91. The presence of solder fillets visually indicates that the first-lead terminal portions 120 are joined to the circuit wiring 91.

In the present embodiment, the first lead 1 has the first-lead-connecting-portion end faces 133 each of which is located between an end in the y direction and the first-lead-terminal-portion end face 123 nearest to that end as viewed in the z direction. The first-lead-connecting-portion end faces 133 are cut surfaces formed in a manufacturing step of cutting connecting portions 1050 of the lead frame 10 (see FIG. 9) along the cut lines 85. The connecting portions 1050 increase the strength of the lead frame 10 for supporting a region corresponding to the first lead 1 to be formed, so that their edges in the y direction are stably held during the process of bonding the semiconductor elements 6a and 6b and bonding the bonding wires 71 and 72 to the electrodes of the semiconductor elements 6a and 6b.

In the present embodiment, the first-lead-terminal-portion end faces 123 are spaced apart from any first-lead-connecting-portion end face 133 in the y direction. The y-direction dimension of the individual end face is smaller than it would be if all the end faces were provided as one continuous surface. This is effective to reduce the size of burrs in the y direction, which may be formed in a manufacturing step of cutting the lead frame 10 in the y direction.

In the present embodiment, all the surfaces of the leads 1 to 5 exposed from the sealing resin 8 are provided with a surface plating layer. The surface plating layer is made of a material having better solder wettability than the base material of the leads 1 to 5. This facilitates the adhesion of solder to all the surfaces of the leads 1 to 5 exposed from the sealing resin 8 at the time of mounting the semiconductor device A1 on, for example, a circuit board. Consequently, the bonding strength of the semiconductor device A1 improves. In addition, a larger solder fillet 92 forms on each first-lead-terminal-portion end face 123. This makes it easier to confirm the bonding of the first lead 1 by inspecting the outer appearance after mounting.

Although in this embodiment, all the surfaces of the leads 1 to 5 exposed from the sealing resin 8 are plated, the present disclosure is not limited to such. The leads 1 to 5 may be without any surface plating layer covering the surfaces exposed from the sealing resin 8. Although no surface plating layer is provided, small solder fillets 92 may still form. Even if no solder fillet 92 forms, some amount of solder is squeezed out onto the circuit wiring 91. Thus, the bonding of the first lead 1 can be confirmed by inspecting the outer appearance.

In the present embodiment, each of the first-lead-terminal-portion end faces 123, first-lead-connecting-portion end faces 133, second-lead-terminal-portion end faces 223, second-lead-connecting-portion end face 233, third-lead-terminal-portion end faces 323, third-lead-connecting-portion end face 333, fourth-lead-terminal-portion end face 423, fourth-lead-connecting-portion end face 433, fifth-lead-terminal-portion end face 523 and fifth-lead-connecting-portion end face 533 is flush with a resin side surface 83 of the sealing resin 8. However, the present disclosure is not limited to such. Each end face may be projected beyond or retracted from a resin side surface 83. In addition, each end face may be flat, curved or corrugated. In addition, the outer shape of each end face is not specifically limited.

In the present embodiment, each semiconductor element 6 has a back surface electrode (third electrode 63), and the mounting-portion back surface 112 serves as a back surface terminal, though the present disclosure is not limited to such a configuration. The semiconductor element 6 may be without a back surface electrode, and the mounting-portion back surface 112 then serves as a heat-dissipating pad for transferring head generated by the semiconductor element 6. The bonding of the mounting-portion back surface 112 to the circuit board 9 or a heat dissipating member can be confirmed by inspecting the outer appearance.

Figure 11:
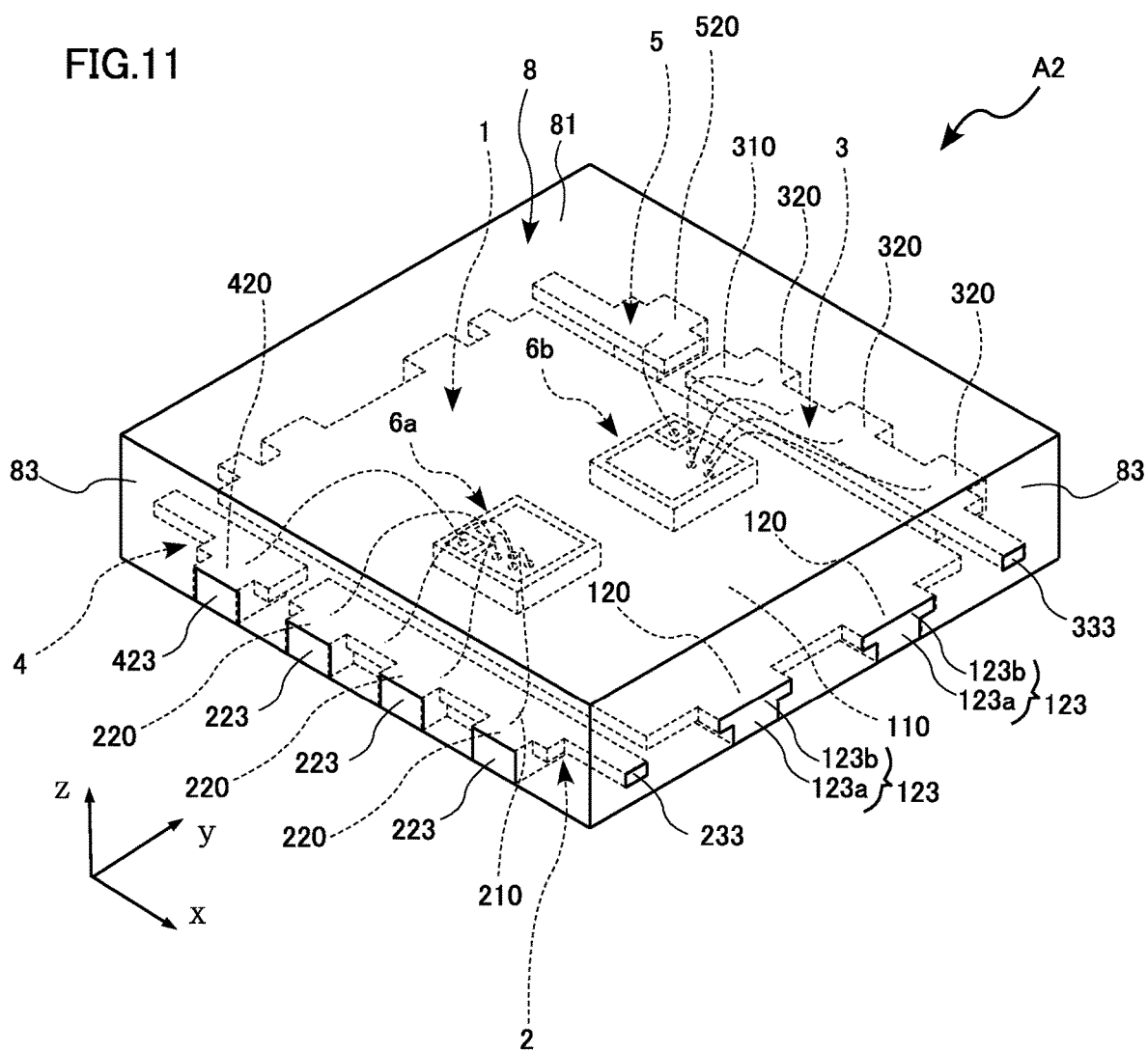
FIG. 11 is a perspective view of a semiconductor device according to a second embodiment.
Figure 12:
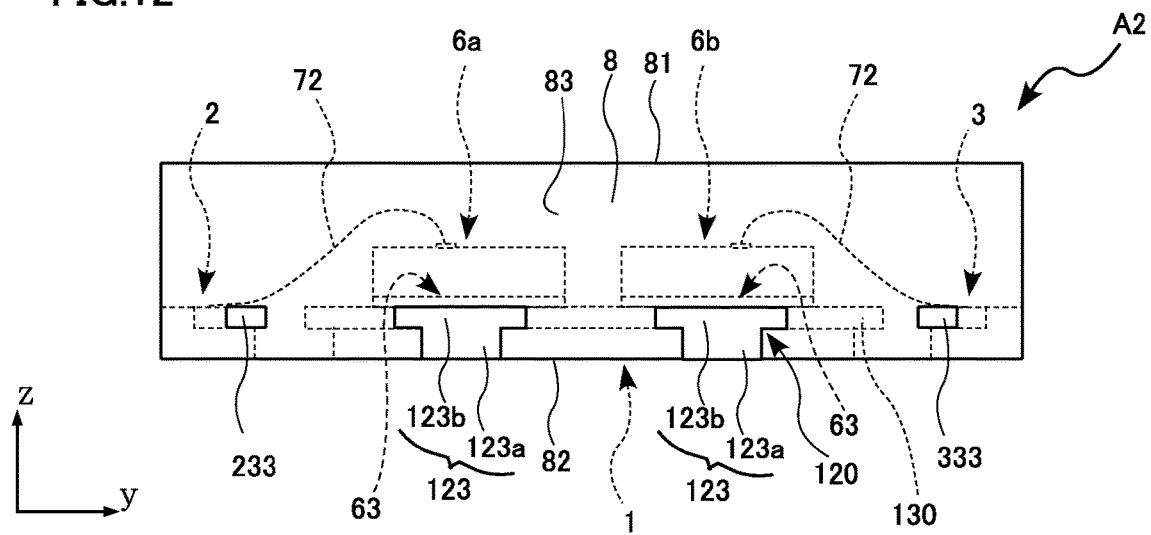
FIG. 12 is a right side view of the semiconductor device shown in FIG. 11.

With reference to FIGS. 11 and 12, a semiconductor device A2 according to a second embodiment will be described. In these figures, the same or similar elements to those of the semiconductor device A1 are denoted by the same reference signs, and a redundant description thereof is omitted.

FIG. 11 is a perspective view of the semiconductor device A2. FIG. 12 is a right side view of the semiconductor device A2.

The semiconductor device A2 differs from the semiconductor device A1 in the shape of the first lead 1. In the present embodiment, the first lead 1 has four projections projecting in the x direction from the first-lead connecting portion 130, and each projection is integral with a first-lead terminal portion 120. That is, each first-lead-terminal-portion end face 123 has a T-like shape, defined by a narrower portion 123*a* and a wider portion 123*b* that is wider than the narrower portion 123*a* in the y direction. The narrower portion 123*a* is located toward the first-lead-terminal-portion back surface 122, and the wider portion 123*b* is located toward the first-lead-terminal-portion front surface 121. In addition, the first lead 1 does not have any first-lead-connecting-portion end face 133. Each first-lead-terminal-portion end face 123 of the semiconductor device A2 may be considered as a combination of a first-lead-terminal-portion end face 123 and a first-lead-connecting-portion end face 133 according to the first embodiment.

In the present embodiment, each first-lead terminal portion 120 includes a first-lead-terminal-portion end face 123 exposed from a resin side surface 83 and a first-lead-terminal-portion back surface 122 exposed from the resin back surface 82, and the first-lead-terminal-portion end face 123 and the first-lead-terminal-portion back surface 122 connected to form a terminal. When the semiconductor device A2 is joined to a circuit board, a solder fillet forms on each first-lead-terminal-portion end face 123. This enables the bonding of the first lead 1 to be confirmed by inspecting the outer appearance.

In the present embodiment, in addition, the first lead 1 has no first-lead-connecting-portion end face 133. The spacing between the wider portion 123*b* of each first-lead-terminal-portion end face 123 and the second-lead-connecting-portion end face 233 (or the third-lead-connecting-portion end face 333) in the y direction is greater than the spacing according to the first embodiment between each first-lead-connecting-portion end face 133 and the second-lead-connecting-portion end face 233 (or the third-lead-connecting-portion end face 333). This reduces the possibility that burrs are formed on the first-lead-terminal-portion end faces 123 in the cutting step and accidentally connected to the second-lead-connecting-portion end face 233 (or the third-lead-connecting-portion end face 333).

In the present embodiment, each first-lead-terminal-portion end face 123 has a wider portion 123*b* that is wider than the narrower portion 123*a* in the y direction. The lead frame 10 (see FIG. 9) used in the manufacturing steps has portions which will form the wider portions 123*b* of the first-lead terminal portions 120. These portions increase the strength of the lead frame 10 for supporting a region corresponding to the first lead 1 to be formed, so that their edges in the y direction are stably held during the process of bonding the semiconductor elements 6*a* and 6*b* and bonding the bonding wires 71 and 72 to the electrodes of the semiconductor elements 6*a* and 6*b*.

Figure 13:
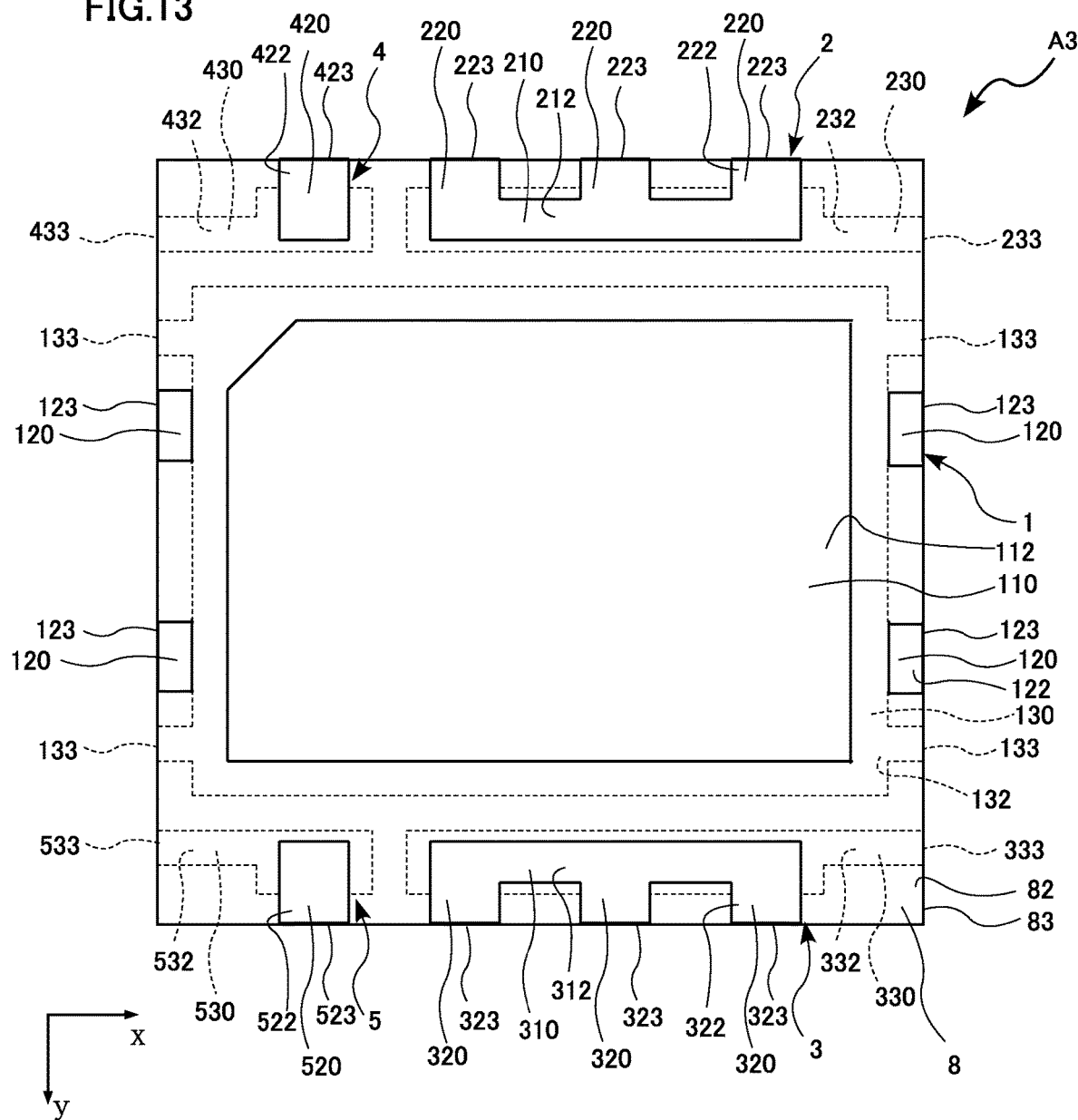
FIG. 13 is a bottom view of a semiconductor device according to a third embodiment.

With reference to FIG. 13, a semiconductor device A3 according to a third embodiment will be described. In FIG. 13, the same or similar elements to those of the semiconductor device A1 are denoted by the same reference signs, and a redundant description thereof is omitted. FIG. 13 is a bottom view of the semiconductor device A3.

The semiconductor device A3 differs from the semiconductor device A1 in the shape of the first lead 1. The first lead 1 of the present embodiment is configured such that the first-lead connecting portion 130 surrounds the mounting portion 110, and the first-lead terminal portions 120 are provided on either end face of the first-lead connecting portion 130 in the x direction. The first lead 1 of the present embodiment may be considered similar to the first lead 1 of the first embodiment, except that each first-lead-terminal-portion back surface 122 is not connected to the mounting-portion back surface 112. In the present embodiment, although the mounting-portion back surface 112 and the first-lead-terminal-portion back surfaces 122 are not connected, the mounting portion 110 and the first-lead terminal portions 120 are connected via the first-lead connecting portions 130.

The present embodiment achieves the same advantages as those achieved by the first embodiment.

Figure 14:
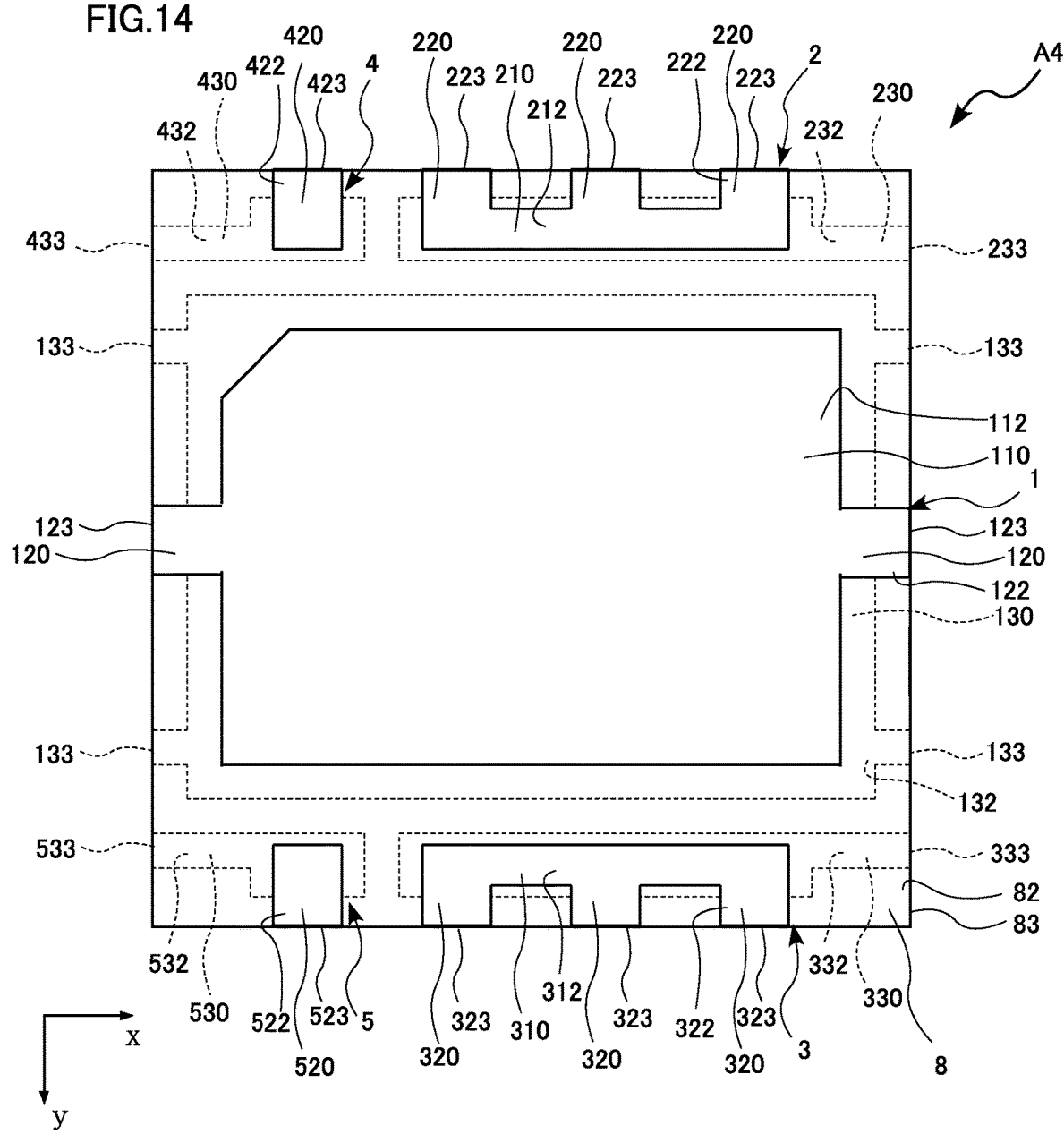
FIG. 14 is a bottom view of a semiconductor device according to a fourth embodiment.

With reference to FIG. 14, a semiconductor device A4 according to a fourth embodiment will be described. In FIG. 14, the same or similar elements to those of the semiconductor device A1 are denoted by the same reference signs, and a redundant description thereof is omitted. FIG. 14 is a bottom view of the semiconductor device A4.

The semiconductor device A4 differs from the semiconductor device A1 in the shape of the first lead 1. The first lead 1 according to the present embodiment has one first-lead terminal portion 120 on either end face of the mounting portion 110 in the x direction and at a center of the end face in the y direction. That is, two first-lead terminal portions 120 are provided in total.

The present embodiment achieves the same advantages as those achieved by the first embodiment.

Figure 15:
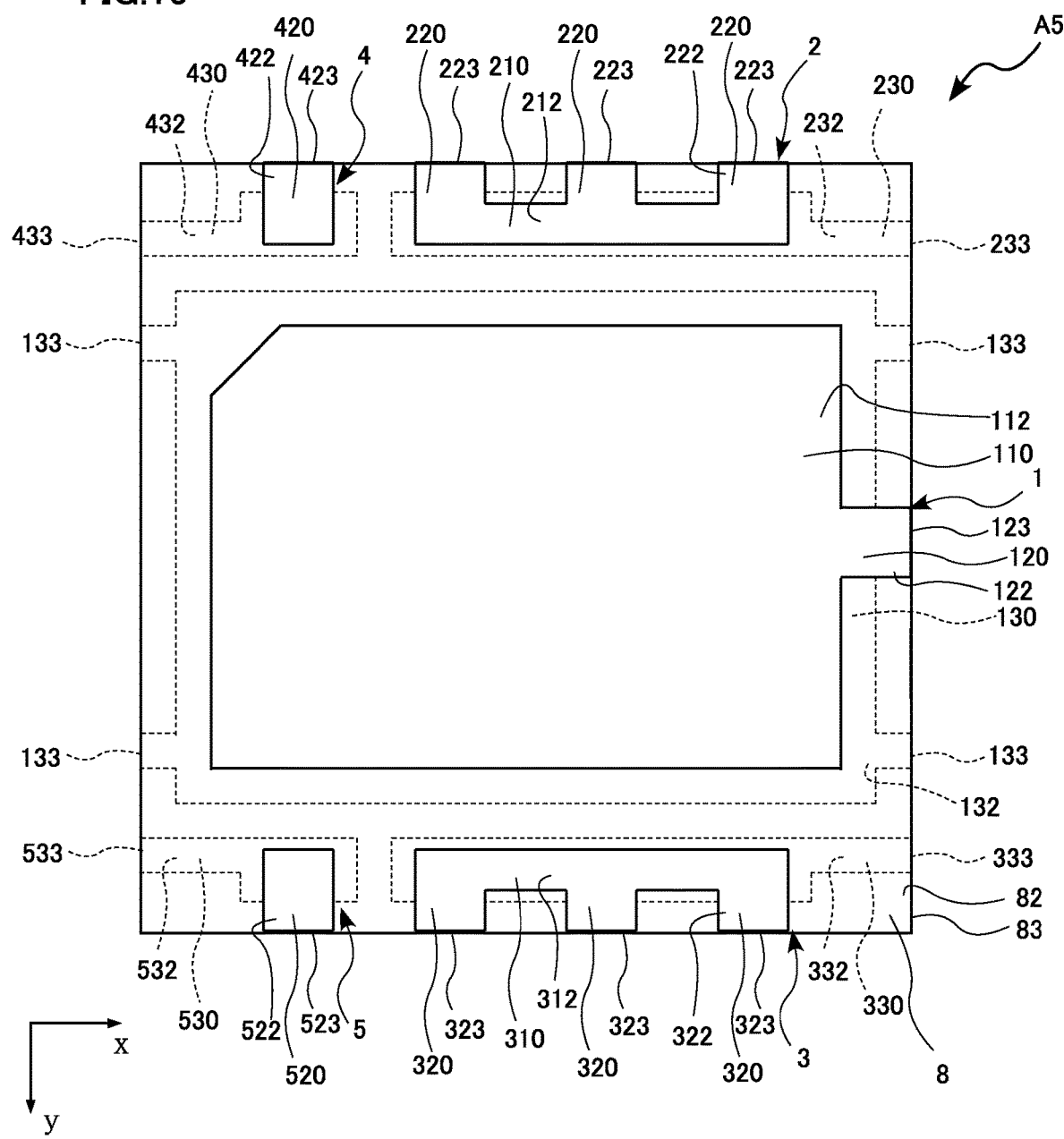
FIG. 15 is a bottom view of a semiconductor device according to a fifth embodiment.

With reference to FIG. 15, a semiconductor device A5 according to a fifth embodiment will be described. In FIG. 15, the same or similar elements to those of the semiconductor device A1 are denoted by the same reference signs, and a redundant description thereof is omitted. FIG. 15 is a bottom view of the semiconductor device A5.

The semiconductor device A5 differs from the semiconductor device A1 in the shape of the first lead 1. The first lead 1 according to the present embodiment has one first-lead terminal portion 120 on one end face of the mounting portion 110 in the x direction and at a center of the end face in the y direction. That is, only one first-lead terminal portion 120 is provided in total.

The present embodiment achieves the same advantages as those achieved by the first embodiment.

As shown in the first, fourth and fifth embodiments, the number of the first-lead terminal portions 120 included in the first lead 1 is not limited. It is sufficient that the first lead 1 includes at least one first-lead terminal portion 120. As long as the first lead 1 includes at least one first-lead terminal portion 120, the bonding of the first lead 1 can confirmed by inspecting the appearance.

Figure 16:
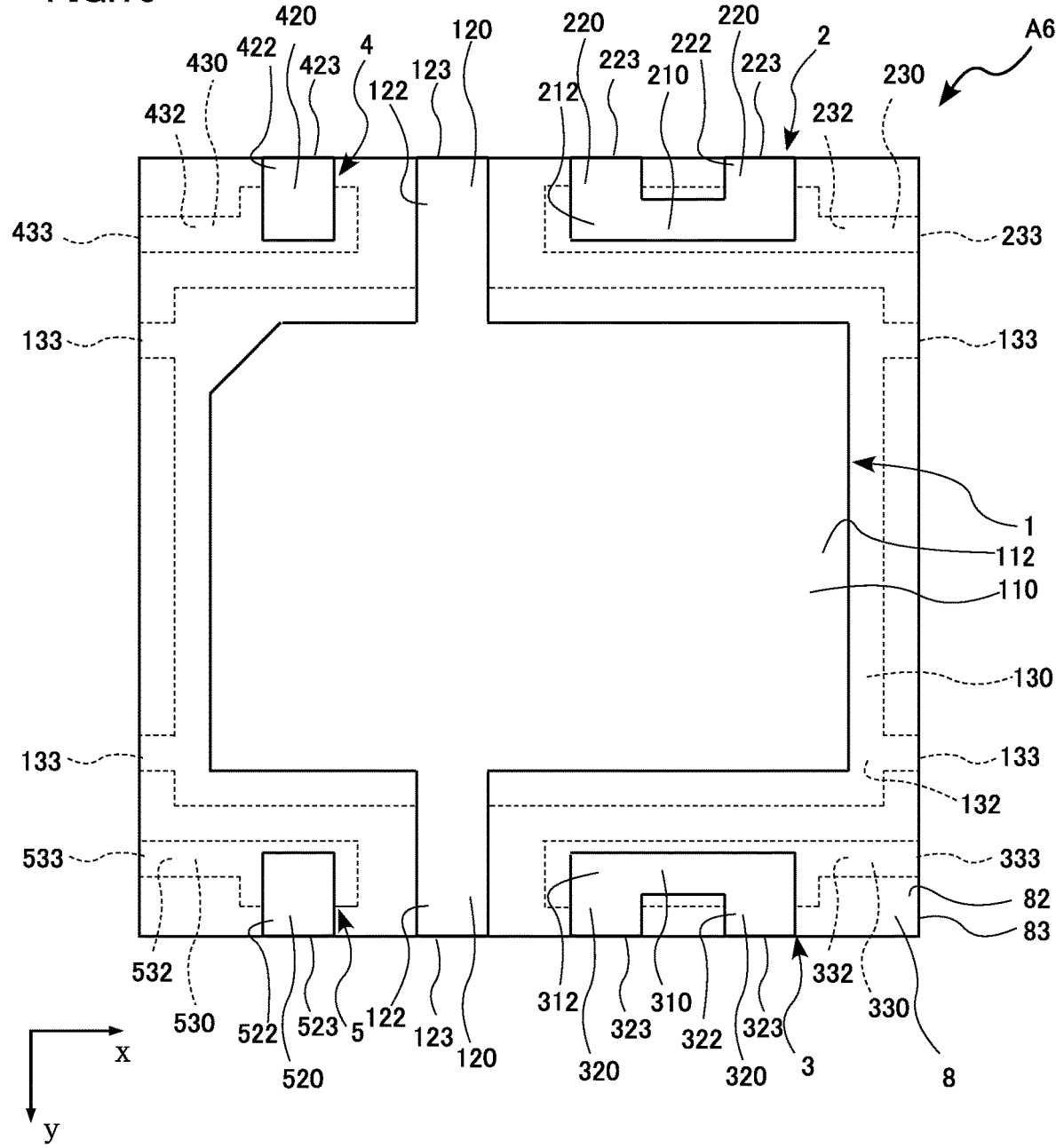
FIG. 16 is a bottom view of a semiconductor device according to a sixth embodiment.

With reference to FIG. 16, a semiconductor device A6 according to a sixth embodiment will be described. In FIG. 16, the same or similar elements to those of the semiconductor device A1 are denoted by the same reference signs, and a redundant description thereof is omitted. FIG. 16 is a bottom view of the semiconductor device A6.

The semiconductor device A6 differs from the semiconductor device A1 in the shapes of the first lead 1, the second lead 2 and the third lead 3. The second lead 2 according to the present embodiment only has two second-lead terminal portions 220, and the wire bonding portion 210 is smaller in the x-direction dimension than that in the first embodiment. The x-direction dimension of the second lead 2 is accordingly smaller, and the spacing between the second lead 2 and the fourth lead 4 is wider. In addition, the third lead 3 according to the present embodiment only has two third-lead terminal portions 320, and the wire bonding portion 310 is smaller in the x-direction dimension than that in the first embodiment. The x-direction dimension of the third lead 3 is accordingly smaller, and the spacing between the third lead 3 and the fifth lead 5 is wider.

The first lead 1 according to the present embodiment has two first-lead terminal portions 120. One of the first-lead terminal portions 120 is connected to one end face of the mounting portion 110 in the y direction and located between the second lead 2 and the fourth lead 4. The other of the first-lead terminal portions 120 is connected to the other end face of the mounting portion 110 in the y direction and located between the third lead 3 and the fifth lead 5. That is, each first-lead-terminal-portion end face 123 faces in the y direction.

Also in the present embodiment, each first-lead terminal portion 120 serves as a terminal where the first-lead-terminal-portion end face 123 exposed from a resin side surface 83 and the first-lead-terminal-portion back surface 122 exposed from the resin back surface 82 are connected to each other. When the semiconductor device A6 is joined to a circuit board, a solder fillet forms on each first-lead-terminal-portion end face 123. This enables visual confirmation of the bonding of the first lead 1, merely by inspecting the post-mounting appearance of the product.

Also in the present embodiment, the lead frame 10 (see FIG. 9) used in the manufacturing steps has connecting portions 1050. The first lead 1 of this embodiment includes a first-lead terminal portion 120 on either end face of the mounting portion 110 in the y direction. This configuration increases the strength of the lead frame 10 for supporting a region corresponding to the mounting portion 110 to be formed, so that their edges in the y direction are stably held during the process of bonding the semiconductor elements 6a and 6b and bonding the bonding wires 71 and 72 to the electrodes of the semiconductor elements 6a and 6b.

Figure 17:
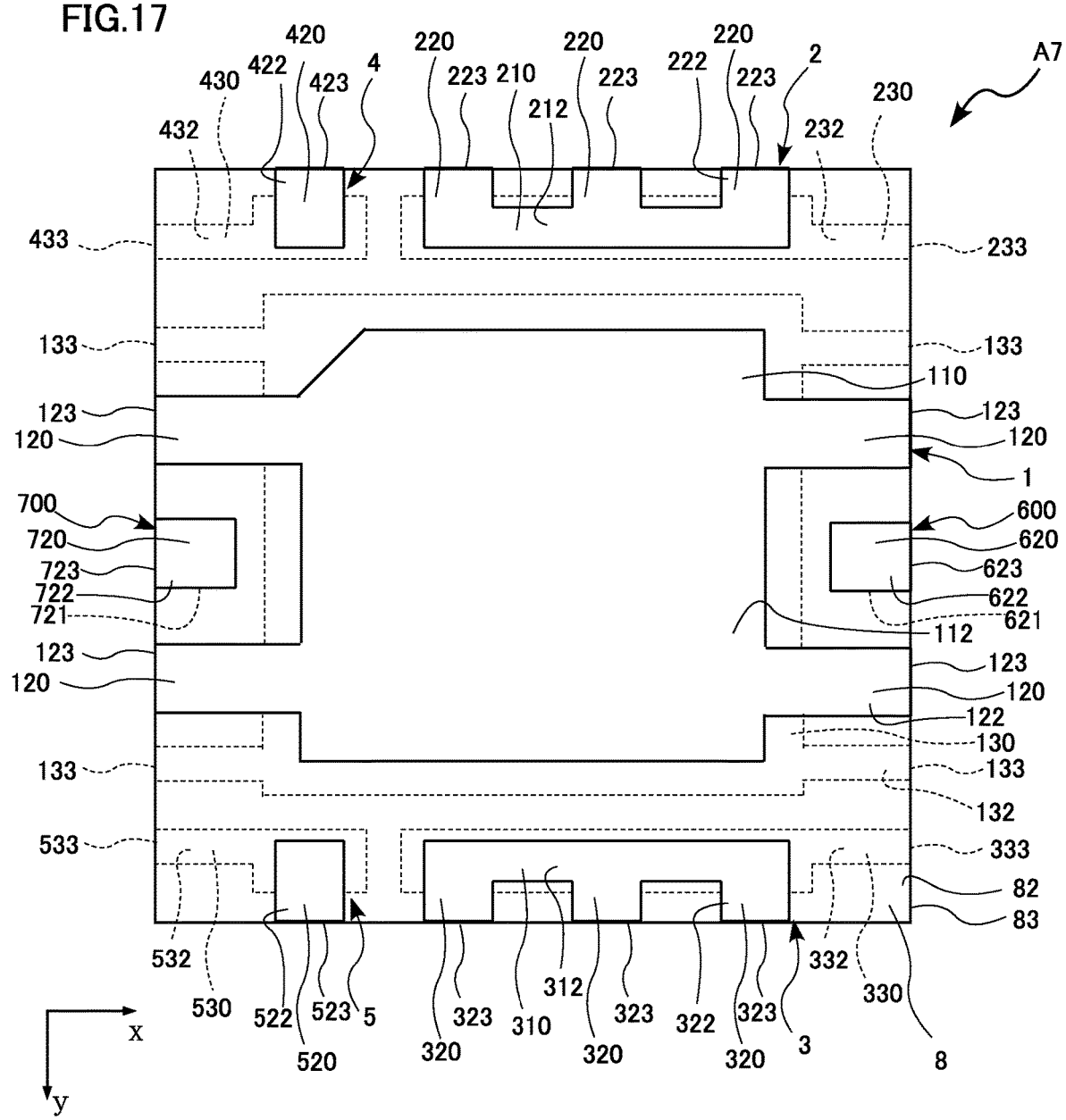
FIG. 17 is a bottom view of a semiconductor device according to a seventh embodiment.

With reference to FIG. 17, a semiconductor device A7 according to a seventh embodiment will be described. In FIG. 17, the same or similar elements to those of the semiconductor device A1 are denoted by the same reference signs, and a redundant description thereof is omitted. FIG. 17 is a bottom view of the semiconductor device A7.

The semiconductor device A7 differs from the semiconductor device A1 in the shape of the first lead 1 and also differs in that a sixth lead 600 and a seventh lead 700 are additionally included. As compared with first embodiment, the mounting portion 110 of the first lead 1 is smaller in the x-direction dimension, and each first-lead terminal portion 120 of the first lead 1 is larger in the x-direction. The sixth lead 600 is located between the two first-lead terminal portions 120 on one end face of the mounting portion 110 in the x direction, and the seventh lead 700 is located between the two first-lead terminal portions 120 on the other end face of the mounting portion 110 in the x direction. Both the sixth lead 600 and the seventh lead 700 are separated from the first lead 1.

The sixth lead 600 includes a sixth-lead terminal portion 620. The sixth-lead terminal portion 620 is rectangular as viewed in z direction. The sixth-lead terminal portion 620 has a sixth-lead-terminal-portion front surface 621, a sixth-lead-terminal-portion back surface 622 and a sixth-lead-terminal-portion end face 623. The sixth-lead-terminal-portion front surface 621 and the sixth-lead-terminal-portion back surface 622 face opposite to each other in the z direction. The sixth-lead-terminal-portion front surface 621 is where a bonding wire is bonded. The sixth-lead-terminal-portion end face 623 faces outward in the x direction and connects the sixth-lead-terminal-portion front surface 621 and the sixth-lead-terminal-portion back surface 622. The sixth-lead-terminal-portion back surface 622 and the sixth-lead-terminal-portion end face 623 are exposed from the sealing resin 8 and connected to form a terminal. The sixth lead 600 has a surface plating layer (not shown) on all the surfaces exposed from the sealing resin 8. In the present embodiment, the surface plating layer is provided on the sixth-lead-terminal-portion back surface 622 and the sixth-lead-connecting-portion end face 623.

The seventh lead 700 includes a seventh-lead terminal portion 720. The seventh-lead terminal portion 720 is rectangular as viewed in z direction. The seventh-lead terminal portion 720 has a seventh-lead-terminal-portion front surface 721, a seventh-lead-terminal-portion back surface 722 and a seventh-lead-terminal-portion end face 723. The seventh-lead-terminal-portion front surface 721 and the seventh-lead-terminal-portion back surface 722 face opposite to each other in the z direction. The seventh-lead-terminal-portion front surface 721 is where a bonding wire is bonded. The seventh-lead-terminal-portion end face 723 faces outward in the x direction and connects the seventh-lead-terminal-portion front surface 721 and the seventh-lead-terminal-portion back surface 722. The seventh-lead-terminal-portion back surface 722 and the seven-lead-terminal-portion end face 723 are exposed from the sealing resin 8 and connected to form a terminal. The seventh lead 700 has a surface plating layer (not shown) on all the surfaces exposed from the sealing resin 8. In the present embodiment, the surface plating layer is provided on the seventh-lead-terminal-portion back surface 722 and the seventh-lead-connecting-portion end face 723.

The present embodiment achieves the same advantages as those achieved by the first embodiment. The present embodiment may include an additional sixth-lead terminal portion 620 and an additional seventh-lead terminal portion 720 each of which is exposed from a resin side surface 83 of the sealing resin 8 facing in the x direction. However, the semiconductor device A7 may be without one of the sixth lead 600 and the seventh lead 700.

The sixth lead 600 and the seventh lead 700 may added to the semiconductor device A6 shown in FIG. 16. Specifically, for the semiconductor device A6, the sixth lead 600 can be disposed between two projected portions on one end face of the first-lead connecting portion 130 in the x direction, and the seventh lead 700 can be disposed between the two projected portions on the other end face of the first-lead connecting portion 130 in the x direction. Both the sixth lead 600 and the seventh lead 700 may be separated from the first lead 1.

Figure 18:
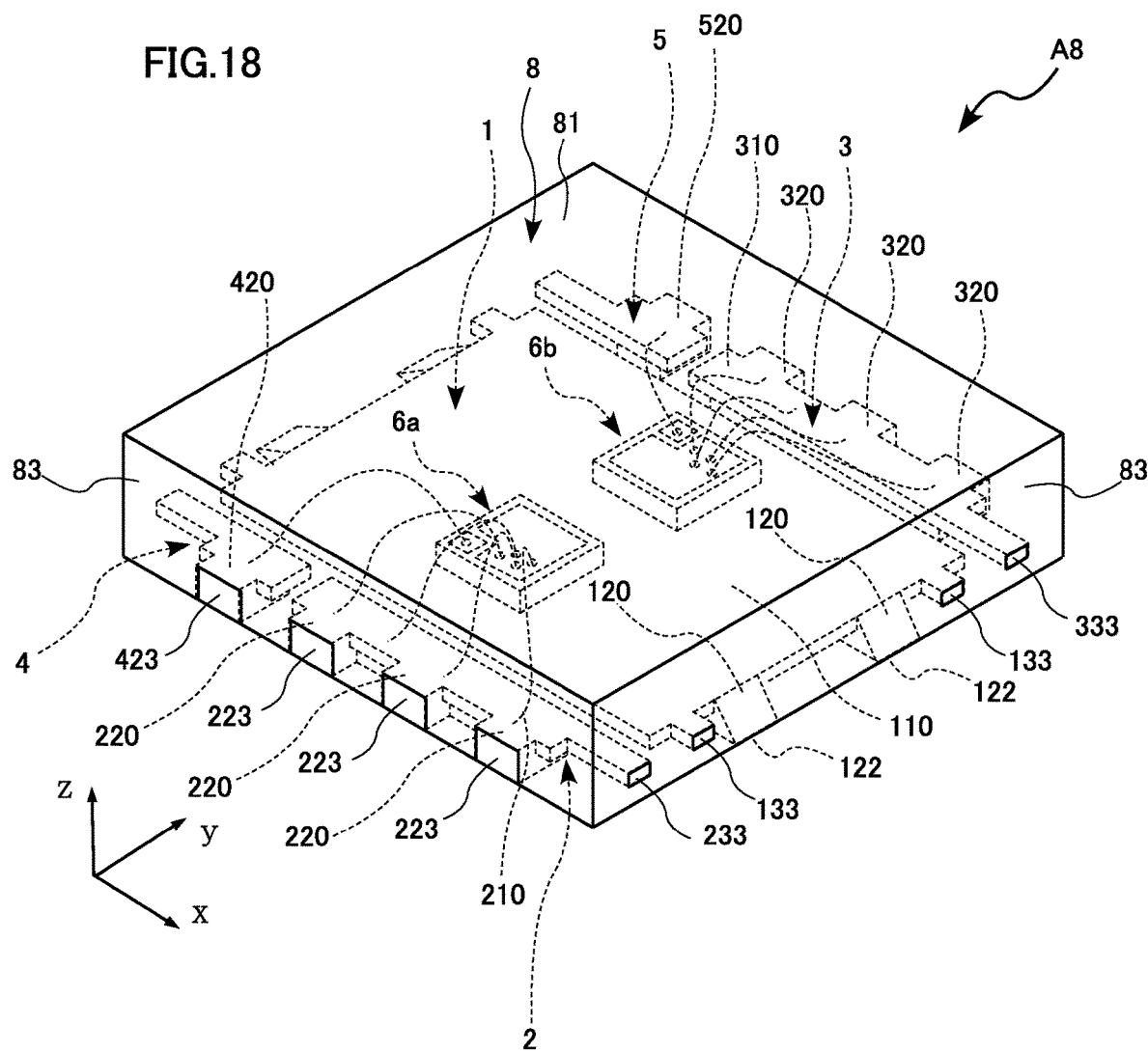
FIG. 18 is a perspective view of a semiconductor device according to an eighth embodiment.

With reference to FIG. 18, a semiconductor device A8 according to an eighth embodiment will be described. In FIG. 18, the same or similar elements to those of the semiconductor device A1 are denoted by the same reference signs, and a redundant description thereof is omitted. FIG. 18 is a perspective view of the semiconductor device A8.

The semiconductor device A8 differs from the semiconductor device A1 in the shape of each first-lead terminal portion 120. Each first-lead terminal portion 120 of the present embodiment is in a wedge shape tapering toward the outer end. While the first-lead-terminal-portion back surface 122 is connected to a resin side surface 83, the first-lead terminal portion 120 is not exposed from the resin side surface 83 and no first-lead-terminal-portion end face 123 is present.

In the present embodiment, each first-lead-terminal-portion back surface 122 is connected to the resin side surface 83, so that solder is squeezed out onto the circuit wiring 91 when the semiconductor device A8 is attached to the circuit board 9. This the enables the bonding of the first lead 1 to be confirmed by inspecting the outer appearance.

The semiconductor devices according to the semiconductor devices are not limited to the specific embodiments described above. Various design changes may be made to the specific structure of each portion of the semiconductor devices according to the present disclosure.

The invention claimed is:

1. A semiconductor device comprising:
a semiconductor element;
a first lead including a mounting portion on which the semiconductor element is mounted, a first terminal portion connected to the mounting portion and a second terminal portion connected to the mounting portion;
a second lead spaced apart from the first lead and formed with a plurality of terminal portions;
a third lead spaced apart from the first lead and the second lead and formed with at least one terminal portion; and
a sealing resin covering the semiconductor element, a portion of the first lead, a portion of the second lead and a portion of the third lead, wherein
the mounting portion includes a mounting-portion front surface and a mounting-portion back surface that are opposite to each other in a thickness direction, the semiconductor element being mounted on the mounting-portion front surface,
the sealing resin includes a resin front surface, a resin back surface, a resin first side surface and a resin second side surface, the resin front surface and the resin back surface being opposite to each other in the thickness direction, each of the resin first side surface and the resin second side surface connecting the resin front surface and the resin back surface, the resin first side surface having two mutually separated edges each extending in the thickness direction,
the mounting-portion back surface is flush with the resin back surface,
the first terminal portion includes a first-terminal-portion back surface exposed from the resin back surface and extending to the resin first side surface, the first-terminal-portion back surface being flush with the mounting-portion back surface,
the second terminal portion incudes a second-terminal-portion back surface exposed from the resin back surface and extending to the resin first side surface, the second-terminal-portion back surface being flush with the mounting-portion back surface,
the first terminal portion includes a first-terminal-portion end face exposed from the resin first side surface in a manner such that the first-terminal-portion end face as a whole is spaced apart from the two edges of the resin first side surface, the first-terminal-portion end face being connected to the first-terminal-portion back surface,
the second terminal portion incudes a second-terminal-portion end face exposed from the resin first side surface in a manner such that the second-terminal-portion end face as a whole is spaced apart from the two edges of the resin first side surface, the second-terminal-portion end face being connected to the second-terminal-portion back surface,
the first-terminal-portion end face and the second-terminal-portion end face are arranged symmetrical with a center line of the resin first side surface that is parallel to the thickness direction,
the plurality of terminal portions of the second lead and the at least one terminal portion of the third lead are exposed from the resin second side surface.

2. The semiconductor device according to claim 1, further comprising wires each extending from the semiconductor element to the second lead.

3. The semiconductor device according to claim 2, further comprising a single additional wire extending from the semiconductor element to the third lead.

4. The semiconductor device according to claim 3, further comprising an additional semiconductor element mounted on the mounting-portion front surface.

5. The semiconductor device according to claim 1, wherein the first lead includes a connecting-portion end face that is exposed from the resin first side surface and spaced apart from the resin back surface.

6. The semiconductor device according to claim 1, wherein
the first-terminal-portion end face includes a narrower portion and a wider portion,
the narrower portion is located closer to the first-terminal-portion back surface than is the wider portion, and
the wider portion has a greater dimension than the narrower portion in a direction perpendicular to the thickness direction.

7. The semiconductor device according to claim 1, wherein the first-terminal-portion back surface and the mounting-portion back surface are connected to each other.

8. The semiconductor device according to claim 1, wherein each of the first terminal portion and the second terminal portion includes an additional part that is exposed from the resin first side surface other than the first-terminal-portion end face and the second-terminal-portion end face.

9. The semiconductor device according to claim 1, wherein the sealing resin includes a resin third side surface opposite to the resin first side surface,
    the first lead is formed with a third terminal portion exposed from the resin third side surface.

10. The semiconductor device according to claim 1, further comprising a fourth lead (2 or 4) that is opposite to the second lead or the third lead with respect to the first lead as viewed in the thickness direction.

11. The semiconductor device according to claim 10, wherein the sealing resin includes a resin fourth side surface opposite to the resin second side surface,
    the fourth lead is formed with at least one terminal portion exposed from the resin fourth side surface.

12. The semiconductor device according to claim 11, further comprising a fifth lead that is opposite to the second lead or the third lead with respect to the first lead as viewed in the thickness direction, the fifth lead being spaced apart from the fourth lead,
    the fifth lead is formed with at least one terminal portion exposed from the resin fourth side surface.

13. The semiconductor device according to claim 12, wherein each of the fourth lead and the fifth lead is exposed from the the resin back surface.

14. The semiconductor device according to claim 12, wherein the fourth lead includes a part that is exposed from the resin first side surface, and
    the fifth lead includes a part that is exposed from the resin third side surface.

15. The semiconductor device according to claim 1, wherein the first lead is electrically connected to the semiconductor element.

16. The semiconductor device according to claim 15, wherein the semiconductor element includes an electrode formed on a surface facing the first lead.

17. The semiconductor device according to claim 1, wherein the semiconductor element comprises a transistor.

18. The semiconductor device according to claim 1, wherein the first lead is formed with a surface plating layer on a portion exposed from the sealing resin.

* * * * *